(12) United States Patent
l'Abee et al.

(10) Patent No.: US 8,552,101 B2
(45) Date of Patent: Oct. 8, 2013

(54) THERMALLY CONDUCTIVE AND ELECTRICALLY INSULATIVE POLYMER COMPOSITIONS CONTAINING A LOW THERMALLY CONDUCTIVE FILLER AND USES THEREOF

(75) Inventors: Roy l'Abee, Eindhoven (NL); Frans Mercx, Halsteren (NL); Mark van der Mee, Breda (NL); Dennis Karlik, Bergen op Zoom (NL); Mingcheng Guo, Shanghai (CN); David Zou, Shanghai (CN)

(73) Assignee: SABIC Innovative Plastics IP B.V., Bergen Op Zoom (NL)

( * ) Notice: Subject to any disclaimer, the term of this patent is extended or adjusted under 35 U.S.C. 154(b) by 0 days.

(21) Appl. No.: 13/402,216

(22) Filed: Feb. 22, 2012

(65) Prior Publication Data

US 2012/0228542 A1 Sep. 13, 2012

Related U.S. Application Data

(60) Provisional application No. 61/446,666, filed on Feb. 25, 2011.

(51) Int. Cl.
*C08K 3/06* (2006.01)

(52) U.S. Cl.
USPC ........... 524/420; 524/404; 524/424; 524/428; 524/432; 524/433

(58) Field of Classification Search
USPC ................. 524/404, 420, 424, 428, 432, 433, 524/495–497
See application file for complete search history.

(56) References Cited

U.S. PATENT DOCUMENTS

| | | | |
|---|---|---|---|
| 2,465,319 A | 3/1949 | Whinfield | 260/75 |
| 3,047,539 A | 7/1962 | Pengilly | 260/75 |
| 3,953,404 A | 4/1976 | Borman | 260/75 |
| 4,508,504 A * | 4/1985 | Eschmann et al. | 432/217 |
| 5,232,970 A | 8/1993 | Sole | 524/404 |
| 5,373,046 A | 12/1994 | Okamura | 524/413 |
| 5,844,037 A | 12/1998 | Lundgard | 524/496 |
| 6,048,919 A | 4/2000 | McCullough | 524/404 |
| 6,103,805 A | 8/2000 | Kojima | 524/442 |
| 6,162,849 A | 12/2000 | Zhuo | 524/404 |
| 6,165,612 A | 12/2000 | Misra | 428/344 |
| 6,251,978 B1 | 6/2001 | McCullough | 524/404 |
| 6,441,075 B2 | 8/2002 | Hirata | 524/423 |
| 6,500,891 B1 | 12/2002 | Kropp | 524/430 |
| 6,545,081 B1 | 4/2003 | Nishihata | 524/495 |
| 6,562,891 B1 | 5/2003 | Tsai | 524/445 |
| 6,600,633 B2 | 7/2003 | Macpherson | 360/265.8 |
| 6,620,497 B2 | 9/2003 | Smith | 428/323 |
| 6,710,109 B2 | 3/2004 | McCullough | 524/404 |
| 6,730,731 B2 | 5/2004 | Tobita | 524/495 |
| 6,756,005 B2 | 6/2004 | Panek | 264/255 |
| 6,835,347 B2 | 12/2004 | McCullough | 364/478 |
| 6,899,160 B2 | 5/2005 | McCullough | 164/303 |
| 6,926,955 B2 | 8/2005 | Jayaraman | 428/323 |
| 6,976,769 B2 | 12/2005 | McCullough | 362/345 |
| 6,981,805 B2 | 1/2006 | Miller | 385/92 |
| 7,019,062 B2 | 3/2006 | Beek | 525/397 |
| 7,077,990 B2 | 7/2006 | Miller | 264/272.2 |
| 7,189,778 B2 | 3/2007 | Tobita | 524/495 |
| 7,462,309 B2 | 12/2008 | Miller | 264/104 |
| 7,476,702 B2 | 1/2009 | Sagal | 524/404 |
| 7,847,012 B2 | 12/2010 | Fujimoto et al. | |
| 8,003,016 B2 | 8/2011 | Mercx | 252/511 |
| 8,029,694 B2 | 10/2011 | Saga | 252/299.01 |
| 8,065,451 B2 | 11/2011 | Jiaxiang | 710/62 |
| 8,198,347 B2 | 6/2012 | Fung | 523/433 |
| 2003/0139510 A1 | 7/2003 | Sagal | 524/404 |
| 2004/0167264 A1 | 8/2004 | Vathauer et al. | |
| 2005/0209383 A1 | 9/2005 | Miller | 524/404 |
| 2005/0272845 A1 | 12/2005 | Miller | 428/412 |
| 2006/0099338 A1 | 5/2006 | Boelz | 428/343 |
| 2006/0293427 A1 | 12/2006 | Martens et al. | |
| 2007/0045823 A1 | 3/2007 | Miller | 257/706 |
| 2008/0039575 A1 | 2/2008 | Mercx | 524/496 |

(Continued)

FOREIGN PATENT DOCUMENTS

| | | |
|---|---|---|
| EP | 0421193 | 4/1991 |
| EP | 0933397 | 4/1998 |

(Continued)

OTHER PUBLICATIONS

Database WPI, Week 200578, Thomson Scientific, London. AN 2005-762436.
Polyolefin Compound (Mikrolene). http://www.mikrons.com.tr/index.asp?action=mikrolene, accessed Jun. 28, 2012.
Roussel, M.D., et al., The use of calcium carbonate in polyolefins offers significant improvement in productivity. 2005 PLACE Conference, Las Vegas.
Technology Plastics, Omya A.G., Calcium carbonate in polyolefines, Review, Technical Information Plastics R4-01(2001).
Preliminary Amendment filed May 24, 2012 for U.S. Appl. No. 13/402,202, which was filed Feb. 22, 2012 [Inventor—Roy L'Abee; Applicant—Sabic Innovative Plastics IP B.V.] [pp. 1-7].

(Continued)

*Primary Examiner* — Peter Szekely
(74) *Attorney, Agent, or Firm* — Ballard Spahr LLP

(57) ABSTRACT

Disclosed herein are compositions comprising a. from 35 to 80 vol % of a thermoplastic polymer; b. from 5 to 45 vol % of a low thermally conductive, electrically insulative filler with an intrinsic thermal conductivity of from 10 to 30 W/mK; c. from 5 to 15 vol % of a high thermally conductive, electrically insulative filler with an intrinsic thermal conductivity greater than or equal to 50 W/mK; and d. from 5 to 15 vol % of a high thermally conductive, electrically conductive filler with an intrinsic thermal conductivity greater than or equal to 50 W/mK, wherein the composition is characterized by: i. a thermal conductivity of at least 1.0 W/mK; and ii. a volume resistivity of at least $10^7$ Ohm.cm. Also disclosed are articles and methods of use therefor.

15 Claims, 6 Drawing Sheets

(56) References Cited

U.S. PATENT DOCUMENTS

| | | | |
|---|---|---|---|
| 2008/0143959 A1 | 6/2008 | Bourdoncle | 351/169 |
| 2008/0153959 A1 | 6/2008 | Charati | 524/404 |
| 2008/0242772 A1 | 10/2008 | Nakamura | 524/70 |
| 2008/0277619 A1 | 11/2008 | Matsumoto | 524/430 |
| 2009/0130471 A1 | 5/2009 | Saga | 428/458 |
| 2009/0152491 A1 | 6/2009 | Saga | 252/74 |
| 2009/0221734 A1 | 9/2009 | Kuwahara | 524/404 |
| 2009/0227707 A1 | 9/2009 | La Camera | 524/157 |
| 2009/0253847 A1 | 10/2009 | Komatsu | 524/437 |
| 2010/0012884 A1 | 1/2010 | Nakamichi | 524/432 |
| 2010/0072416 A1 | 3/2010 | Fujioka et al. | |
| 2010/0113668 A1 | 5/2010 | Saga | 524/425 |
| 2010/0191056 A1 | 7/2010 | Tanaka | 600/117 |
| 2010/0208429 A1 | 8/2010 | Zhang | 523/218 |
| 2010/0219381 A1 | 9/2010 | Jeschke | 252/500 |
| 2011/0027565 A1 | 2/2011 | Matsumoto | 428/220 |
| 2013/0003416 A1 | 1/2013 | Saga et al. | |
| 2013/0068419 A1* | 3/2013 | Mase et al. | 165/46 |

FOREIGN PATENT DOCUMENTS

| | | | |
|---|---|---|---|
| EP | 1260619 A1 | 11/2002 | |
| EP | 1302443 A2 | 4/2003 | |
| EP | 2078736 | 8/2008 | |
| JP | 62100577 | 5/1987 | |
| JP | 2005 298552 | 10/2005 | |
| WO | WO 95/02504 | 1/1995 | |
| WO | WO 2004/056914 | 7/2004 | |
| WO | WO 2005/024942 | 3/2005 | |
| WO | WO-2005/071001 A1 | 8/2005 | |
| WO | WO 2005/123867 | 12/2005 | |
| WO | WO 2006/007385 | 1/2006 | |
| WO | WO 2006/064032 | 6/2006 | |
| WO | WO 2006/135840 | 12/2006 | |
| WO | WO 2008/006443 | 1/2008 | |
| WO | WO 2008/134031 | 11/2008 | |
| WO | WO 2009/012933 | 1/2009 | |
| WO | WO-2009/019186 A1 | 2/2009 | |
| WO | WO 2010/097466 | 9/2010 | |
| WO | WO 2010/053225 | 5/2011 | |

OTHER PUBLICATIONS

"Talc in plastics," Technical Bulletin 1301, Mondo Minerals B.V.
Nunes dos Santos, W., et al., "Thermal diffusivity of polymers by the laser flash technique," Polymer Testing 24, pp. 628-634 (2005).
Radhakrishnan, S., et al., "Role of heat transfer and thermal conductivity in the crystallization behavior of polypropylene-containing additives: a phenomenological model," J. Appl. Pol. Sci. 89, pp. 2994-2999 (2003).
International Search Report and Written Opinion issued Jul. 20, 2012 for International Patent Application No. PCT/IB2012/050854, which was filed Feb. 24, 2012 [Applicant—Sabic Innovative Plastics IP B.V. // pp. 1-12.
International Search Report and Written Opinion issued May 24, 2012 for International Patent Application No. PCT/IB2012/050852, which was filed Feb. 24, 2012 [Applicant—Sabic Innovative Plastics IP B.V. // pp. 1-12.
Non-Final Office Action issued on Jan. 10, 2013 for US Pat App. No. for International Patent Application No. PCT/IB2012/050854, which was filed Feb. 22, 2012. (Inventor—R. L'Abee; Applicant—Sabic Innovative Plastics IP B.V. // pp. 1-5).
Final Office Action issued on Jun. 6, 2013 for U.S. Appl. No. 13/402,202, filed Feb. 22, 2012 (Inventor—R. L'Abee // pp. 1-4).

* cited by examiner

THERMALLY CONDUCTIVE AND ELECTRICALLY INSULATIVE POLYMER COMPOSITIONS CONTAINING A LOW THERMALLY CONDUCTIVE FILLER AND USES THEREOF

CROSS-REFERENCE TO RELATED APPLICATIONS

This application claims the benefit of priority to U.S. Provisional Application No. 61/446,666, filed on Feb. 25, 2011, which is incorporated by reference herein in its entirety.

BACKGROUND

A need exists for polymer composites that are thermally conductive, yet electrically insulative. Polymers are electrical and thermal insulators, so thermally conductive fillers have to be added to provide thermal conductivity. High volume contents of filler are needed to achieve thermal conductivities suitable for efficient heat transport through a polymer composite. The use of electrically conductive fillers in such applications is limited to low volume contents, since electrical conductivity is achieved at significantly lower filler loadings than thermal conductivity. Therefore, typically so-called ceramic fillers with high thermal conductivities are added to these polymer compositions. The number of ceramic filler types that can currently be used for thermally conductive composites is relatively limited, since most ceramic fillers are thermally insulative or have a relatively low thermal conductivity. Consequently, ceramic fillers with a high thermal conductivity are typically expensive to use and the design freedom to control other properties, such as mechanicals, flow and heat stability, is limited. There is a need in the art for improved fillers or combinations thereof that achieve thermally conductive, yet electrically insulative properties of polymer composites. In addition, there is a need in the art for less expensive fillers.

SUMMARY OF THE INVENTION

In one aspect, described herein is a composition comprising:
a. from 35 to 80 vol % of a thermoplastic polymer;
b. from 5 to 45 vol % of a low thermally conductive, electrically insulative filler with an intrinsic thermal conductivity of from 10 to 30 W/mK;
c. from 2 to 15 vol % of a high thermally conductive, electrically insulative filler with an intrinsic thermal conductivity greater than or equal to 50 W/mK; and
d. from 2 to 15 vol % of a high thermally conductive, electrically conductive filler with an intrinsic thermal conductivity greater than or equal to 50 W/mK,
wherein the composition is characterized by:
  i. a thermal conductivity of at least 1.0 W/mK;
  ii. a volume resistivity of at least $10^7$ Ohm.cm.

In another aspect, described herein is an article made from the composition.

In yet another aspect, described herein is a method of using a thermoplastic polymer composition in a high thermal conductivity application comprising contacting the thermoplastic polymer composition with an elevated external temperature for a sustained time, wherein the thermoplastic polymer composition is used in an application requiring the composition to have (1) a thermal conductivity of at least 1.0 W/mK, and (2) a volume resistivity of at least $10^7$ Ohm.cm.

To achieve high thermal conductivities in polymer composites, high volume contents of thermally conductive fillers are generally required. The fact that the number of filler types that are both electrically insulative and thermally conductive is limited complicates the development of thermally conductive, electrically insulative polymer composites. However, when using the resin compositions of the invention, a broader variety of ceramic fillers becomes available to develop thermally conductive, electrically insulative polymer composites, since the compositions disclose the use of ceramic fillers with a low thermal conductivity to develop thermally conductive composites. The combination of the disclosed fillers with low and high thermal conductivities leads to electrically insulative composites with an unexpectedly high thermal conductivity, which cannot be achieved by using the individual fillers alone.

Additional advantages will be set forth in part in the description which follows, and in part will be obvious from the description, or can be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

DETAILED DESCRIPTION

Figure 1:
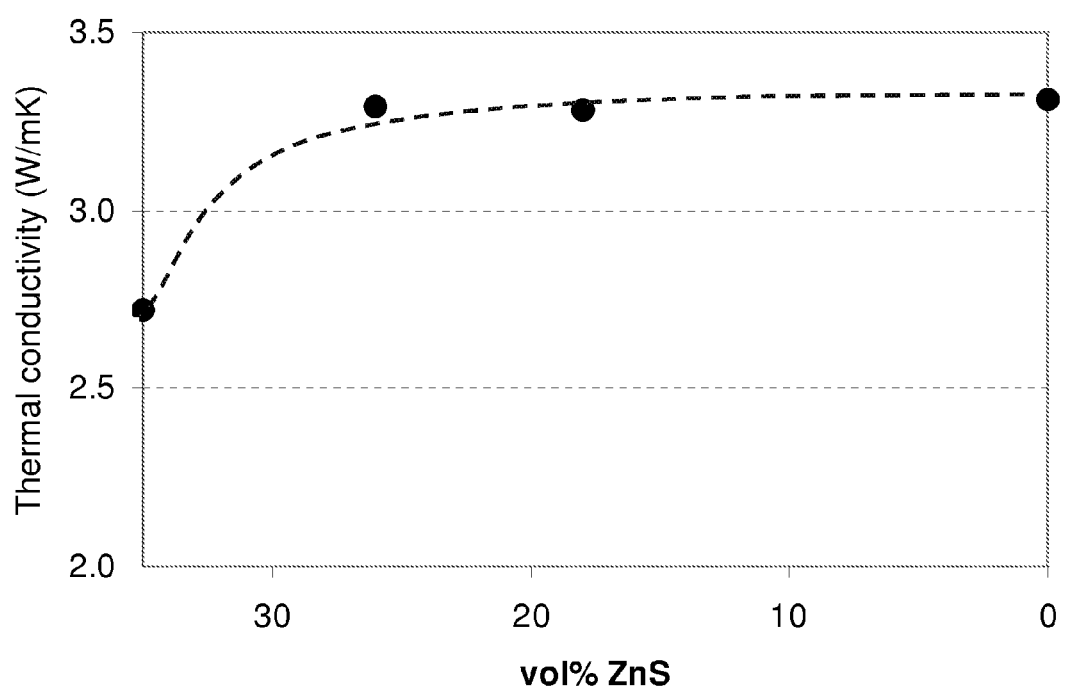
FIG. 1 is graph of thermal conductivity (TC) vs. vol % ZnS for the data from Table 1.

Before the present compounds, compositions, articles, devices, and/or methods are disclosed and described, it is to be understood that the aspects described below are not limited to specific synthetic methods as such may, of course, vary. It is also to be understood that the terminology used herein is for the purpose of describing particular aspects only and is not intended to be limiting.

Disclosed are materials, compounds, compositions, and components that can be used for, can be used in conjunction with, can be used in preparation for, or are products of the disclosed method and compositions. These and other materials are disclosed herein, and it is understood that when combinations, subsets, interactions, groups, etc. of these materials are disclosed that while specific reference of each various individual and collective combinations and permutation of these compounds can not be explicitly disclosed, each is specifically contemplated and described herein. Thus, if a class of fillers A, B, and C are disclosed as well as a class of additives D, E, and F and an example of a combination A-D is disclosed, then even if each is not individually recited, each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to, compositions, and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

In this specification and in the claims which follow, reference will be made to a number of terms which shall be defined to have the following meanings:

It must be noted that, as used in the specification and the appended claims, the singular forms "a," "an" and "the" include plural referents unless the context clearly dictates otherwise. Thus, for example, reference to a thermally insulative filler includes mixtures of thermally insulative fillers.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

References in the specification and concluding claims to parts by weight or volume, of a particular element or component in a composition or article, denotes the weight or volume relationship, respectively, between the element or component and any other elements or components in the composition or article for which a part by weight or volume, respectively, is expressed. Thus, in a composition containing 2 parts by weight of component X and 5 parts by weight component Y, X and Y are present at a weight ratio of 2:5, and are present in such ratio regardless of whether additional components are contained in the composition. This example is equally applicable to parts by volume.

A weight percent or volume percent of a component, unless specifically stated to the contrary, is based on the total weight or volume, respectively, of the formulation or composition in which the component is included.

Intrinsic thermal conductivity of a component, as used herein, is based on indicative values described in the literature, such as in "Thermal conductivity of Nonmetallic Solids," Y.S. Touloukian, R.W. Powell, C.Y. Ho, and P.G. Klemans, IFI/Plenum: New York-Washington, 1970 or "Thermal Conductivity—Theory, Properties and Applications," T.M. Tritt, Ed., Kluwer Academic/Plenum Publishers: New York, 2004. Thermal conductivity of a composition, as used herein, is tested according to ASTM E1461 in the through-plane (sample thickness) direction. Due to the anisotropic nature of some fillers, the through-plane thermal conductivity as measured by ASTM E1461, when using anisotropic fillers, is dependant on sample preparation. All samples as described herein are prepared by compression molding into discs of 12.7 mm in diameter and with a thickness of 3 mm.

Volume resistivity, as used herein, is measured by notching a sample bar on both ends followed by a cold-fracture at $-60°$ C. The fractured surfaces are treated with silver paint and dried. The resistance through the bar is measured with a multi-meter to yield the volume resistivity (in am) and calculated from: volume resistivity=$(R*A/L)$, where R is the electrical resistance (in $\Omega$), A is the sample surface area, and L is the sample length (the electrical distance).

In one aspect, the thermoplastic polymer used in the compositions of the invention is an organic polymer. In this aspect, the organic polymer is selected from a wide variety of thermoplastic resins or blends of thermoplastic resins. The thermoplastic polymer also includes blends of one or more thermoplastic resins with one or more thermosetting resins. The thermoplastic polymer can also be a blend of polymers, copolymers, terpolymers, or combinations including at least one of the foregoing organic polymers. In one aspect, examples of the organic polymer are polyethylene (PE), including high-density polyethylene (HDPE), linear low-density polyethylene (LLDPE), low-density polyethylene (LDPE), mid-density polyethylene (MDPE), glycidyl methacrylate modified polyethylene, maleic anhydride functionalized polyethylene, maleic anhydride functionalized elastomeric ethylene copolymers (like EXXELOR VA1801 and VA1803 from ExxonMobil), ethylene-butene copolymers, ethylene-octene copolymers, ethylene-acrylate copolymers, such as ethylene-methyl acrylate, ethylene-ethyl acrylate, and ethylene butyl acrylate copolymers, glycidyl methacrylate functionalized ethylene-acrylate terpolymers, anhydride functionalized ethylene-acrylate polymers, anhydride functionalized ethylene-octene and anhydride functionalized ethylene-butene copolymers, polypropylene (PP), maleic anhydride functionalized polypropylene, glycidyl methacrylate modified polypropylene, polyacetals, polyacrylics, polycarbonates, polystyrenes, polyesters, polyamides, polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polypyrrolidines, polycarboranes, polyoxabicyclononanes, polydibenzofurans, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polyurethanes, or the like, or a combination including at least one of the foregoing organic polymers.

Specific non-limiting examples of blends of thermoplastic resins include acrylonitrile-butadiene-styrene/nylon, polycarbonate/acrylonitrile-butadiene-styrene, polyphenylene ether/polystyrene, polyphenylene ether/polyamide, polycarbonate/polyester, polyphenylene ether/polyolefin, and combinations including at least one of the foregoing blends of thermoplastic resins.

In one embodiment, an organic polymer that can be used in the conductive composition is a polyarylene ether. The term poly(arylene ether)polymer includes polyphenylene ether (PPE) and poly(arylene ether)copolymers; graft copolymers; poly(arylene ether)ionomers; and block copolymers of alkenyl aromatic compounds with poly(arylene ether)s, vinyl aromatic compounds, and poly(arylene ether), and the like; and combinations including at least one of the foregoing. Poly(arylene ether)polymers per se, are polymers including a plurality of polymer precursors having structural units of the formula (I):

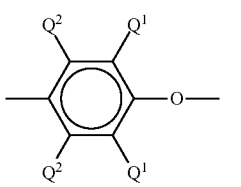
(I)

wherein for each structural unit, each $Q^1$ is independently hydrogen, halogen, primary or secondary lower alkyl (e.g., alkyl containing up to 7 carbon atoms), phenyl, haloalkyl, aminoalkyl, hydrocarbonoxy, halohydrocarbonoxy wherein at least two carbon atoms separate the halogen and oxygen atoms, or the like; and each $Q^2$ is independently hydrogen, halogen, primary or secondary lower alkyl, phenyl, haloalkyl, hydrocarbonoxy, halohydrocarbonoxy wherein at least two carbon atoms separate the halogen and oxygen atoms, or the like. Preferably, each $Q^1$ is alkyl or phenyl, especially $C_{14}$ alkyl, and each $Q^2$ is hydrogen.

Both homopolymer and copolymer poly(arylene ether)s are included. The preferred homopolymers are those containing 2,6-dimethylphenyl ether units. Suitable copolymers include random copolymers containing, for example, such units in combination with 2,3,6-trimethyl-1,4-phenylene ether units or copolymers derived from copolymerization of 2,6-dimethylphenol with 2,3,6-trimethylphenol. Also included are poly(arylene ether) containing moieties prepared by grafting vinyl monomers or polymers such as polystyrenes, as well as coupled poly(arylene ether) in which coupling agents such as low molecular weight polycarbonates, quinones, heterocycles and formals undergo reaction with the hydroxy groups of two poly(arylene ether) chains to produce a higher molecular weight polymer. Poly(arylene ether)s further include combinations including at least one of the above.

The poly(arylene ether) has a number average molecular weight of about 3,000 to about 30,000 g/mole and a weight average molecular weight of about 30,000 to about 60,000 g/mole, as determined by gel permeation chromatography. The poly(arylene ether) can have an intrinsic viscosity of about 0.10 to about 0.60 deciliters per gram (dl/g), as measured in chloroform at 25° C. It is also possible to utilize a high intrinsic viscosity poly(arylene ether) and a low intrinsic viscosity poly(arylene ether) in combination. Determining an exact ratio, when two intrinsic viscosities are used, will depend somewhat on the exact intrinsic viscosities of the poly(arylene ether) used and the ultimate physical properties that are desired.

The poly(arylene ether) is typically prepared by the oxidative coupling of at least one monohydroxyaromatic compound such as 2,6-xylenol or 2,3,6-trimethylphenol. Catalyst systems are generally employed for such coupling; they typically contain at least one heavy metal compound such as a copper, manganese or cobalt compound, usually in combination with various other materials.

Particularly useful poly(arylene ether)s for many purposes are those which include molecules having at least one aminoalkyl-containing end group. The aminoalkyl radical is typically located in an ortho position to the hydroxy group. Products containing such end groups can be obtained by incorporating an appropriate primary or secondary monoamine such as di-n-butylamine or dimethylamine as one of the constituents of the oxidative coupling reaction mixture. Also frequently present are 4-hydroxybiphenyl end groups, typically obtained from reaction mixtures in which a by-product diphenoquinone is present, especially in a copper-halide-secondary or tertiary amine system. A substantial proportion of the polymer molecules, typically constituting as much as about 90% by weight of the polymer, can contain at least one of the aminoalkyl-containing and 4-hydroxybiphenyl end groups.

In another embodiment, the organic polymer used in the conductive composition can be a polycarbonate. Polycarbonates including aromatic carbonate chain units include compositions having structural units of the formula (II):

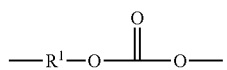
(II)

in which the $R^1$ groups are aromatic, aliphatic or alicyclic radicals. Preferably, $R^1$ is an aromatic organic radical and, more preferably, a radical of the formula (III):

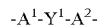
(III)

wherein each of $A^1$ and $A^2$ is a monocyclic divalent aryl radical and $Y^1$ is a bridging radical having zero, one, or two atoms which separate $A^1$ from $A^2$. In an exemplary embodiment, one atom separates $A^1$ from $A^2$. Illustrative examples of radicals of this type are —O—, —S—, —S(O)—, —S(O$_2$)—, —C(O)—, methylene, cyclohexyl-methylene, 2-[2,2,1]-bicycloheptylidene, ethylidene, isopropylidene, neopentylidene, cyclohexylidene, cyclopentadecylidene, cyclododecylidene, adamantylidene, or the like. In another embodiment, zero atoms separate $A^1$ from $A^2$, with an illustrative example being bisphenol. The bridging radical $Y^1$ can be a hydrocarbon group or a saturated hydrocarbon group such as methylene, cyclohexylidene or isopropylidene.

Polycarbonates can be produced by the Schotten-Bauman interfacial reaction of the carbonate precursor with dihydroxy compounds. Typically, an aqueous base such as sodium hydroxide, potassium hydroxide, calcium hydroxide, or the like, is mixed with an organic, water immiscible solvent such as benzene, toluene, carbon disulfide, or dichloromethane, which contains the dihydroxy compound. A phase transfer agent is generally used to facilitate the reaction. Molecular weight regulators can be added either singly or in admixture to the reactant mixture. Branching agents, described forthwith can also be added singly or in admixture.

Polycarbonates can be produced by the interfacial reaction polymer precursors such as dihydroxy compounds in which only one atom separates $A^1$ and $A^2$. As used herein, the term "dihydroxy compound" includes, for example, bisphenol compounds having general formula (IV) as follows:

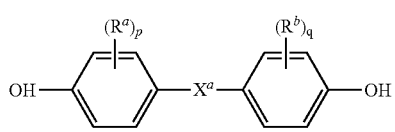
(IV)

wherein $R^a$ and $R^b$ each independently represent hydrogen, a halogen atom, or a monovalent hydrocarbon group; p and q are each independently integers from 0 to 4; and $X^a$ represents one of the groups of formula (V):

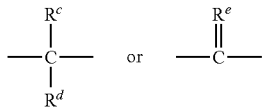

wherein $R^c$ and $R^d$ each independently represent a hydrogen atom or a monovalent linear or cyclic hydrocarbon group, and $R^e$ is a divalent hydrocarbon group.

Examples of the types of bisphenol compounds that can be represented by formula (IV) include the bis(hydroxyaryl) alkane series such as, 1,1-bis(4-hydroxyphenyl)methane, 1,1-bis(4-hydroxyphenyl)ethane, 2,2-bis(4-hydroxyphenyl) propane (or bisphenol-A), 2,2-bis(4-hydroxyphenyl)butane, 2,2-bis(4-hydroxyphenyl)octane, 1,1-bis(4-hydroxyphenyl) propane, 1,1-bis(4-hydroxyphenyl)n-butane, bis(4-hydroxyphenyl)phenylmethane, 2,2-bis(4-hydroxy-1-methylphenyl)propane, 1,1-bis(4-hydroxy-t-butylphenyl)propane, 2,2-bis(4-hydroxy-3-bromophenyl)propane, or the like; bis (hydroxyaryl)cycloalkane series such as, 1,1-bis(4-hydroxyphenyl)cyclopentane, 1,1-bis(4-hydroxyphenyl) cyclohexane, or the like, or combinations including at least one of the foregoing bisphenol compounds.

Other bisphenol compounds that can be represented by formula (IV) include those where X is —O—, —S—, —SO— or —SO$_2$—. Some examples of such bisphenol compounds are bis(hydroxyaryl)ethers such as 4,4'-dihydroxy diphenylether, 4,4'-dihydroxy-3,3'-dimethylphenyl ether, or the like; bis(hydroxy diaryl)sulfides, such as 4,4'-dihydroxy diphenyl sulfide, 4,4'-dihydroxy-3,3'-dimethyl diphenyl sulfide, or the like; bis(hydroxy diaryl)sulfoxides, such as, 4,4'-dihydroxy diphenyl sulfoxides, 4,4'-dihydroxy-3,3'-dimethyl diphenyl sulfoxides, or the like; bis(hydroxy diaryl)sulfones, such as 4,4'-dihydroxy diphenyl sulfone, 4,4'-dihydroxy-3,3'-dimethyl diphenyl sulfone, or the like; or combinations including at least one of the foregoing bisphenol compounds.

Other bisphenol compounds that can be utilized in the polycondensation of polycarbonate are represented by the formula (VI)

wherein, $R^f$, is a halogen atom of a hydrocarbon group having 1 to 10 carbon atoms or a halogen substituted hydrocarbon group; n is a value from 0 to 4. When n is at least 2, $R^f$ can be the same or different. Examples of bisphenol compounds that can be represented by the formula (V), are resorcinol, substituted resorcinol compounds such as 3-methyl resorcin, 3-ethyl resorcin, 3-propyl resorcin, 3-butyl resorcin, 3-t-butyl resorcin, 3-phenyl resorcin, 3-cumyl resorcin, 2,3,4,6-tetrafloro resorcin, 2,3,4,6-tetrabromo resorcin, or the like; catechol, hydroquinone, substituted hydroquinones, such as 3-methyl hydroquinone, 3-ethyl hydroquinone, 3-propyl hydroquinone, 3-butyl hydroquinone, 3-t-butyl hydroquinone, 3-phenyl hydroquinone, 3-cumyl hydroquinone, 2,3,5,6-tetramethyl hydroquinone, 2,3,5,6-tetra-t-butyl hydroquinone, 2,3,5,6-tetrafloro hydroquinone, 2,3,5,6-tetrabromo hydroquinone, or the like; or combinations including at least one of the foregoing bisphenol compounds.

Bisphenol compounds such as 2,2,2',2'-tetrahydro-3,3,3', 3'-tetramethyl-1,1'-spirobi-[IH-indene]-6,6'-diol represented by the following formula (VII) can also be used.

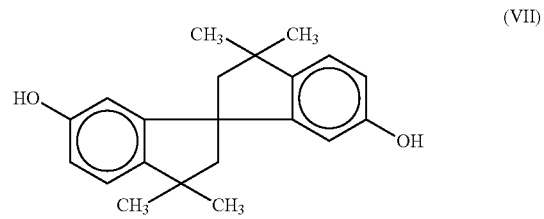

In one aspect, the bisphenol compound is bisphenol A.

Typical carbonate precursors include the carbonyl halides, for example carbonyl chloride (phosgene), and carbonyl bromide; the bis-haloformates, for example, the bis-haloformates of dihydric phenols such as bisphenol A, hydroquinone, or the like, and the bis-haloformates of glycols such as ethylene glycol and neopentyl glycol; and the diaryl carbonates, such as diphenyl carbonate, di(tolyl)carbonate, and di(naphthyl)carbonate. The preferred carbonate precursor for the interfacial reaction is carbonyl chloride.

It is also possible to employ polycarbonates resulting from the polymerization of two or more different dihydric phenols or a copolymer of a dihydric phenol with a glycol or with a hydroxy- or acid-terminated polyester or with a dibasic acid or with a hydroxy acid or with an aliphatic diacid in the event a carbonate copolymer rather than a homopolymer is desired for use. Generally, useful aliphatic diacids have about 2 to about 40 carbons. A preferred aliphatic diacid is dodecanedioic acid.

Branched polycarbonates, as well as blends of linear polycarbonate and a branched polycarbonate can also be used in the composition. The branched polycarbonates can be prepared by adding a branching agent during polymerization. These branching agents can include polyfunctional organic compounds containing at least three functional groups, which can be hydroxyl, carboxyl, carboxylic anhydride, haloformyl, and combinations including at least one of the foregoing branching agents. Specific examples include trimellitic acid, trimellitic anhydride, trimellitic trichloride, tris-p-hydroxy phenyl ethane, isatin-bis-phenol, tris-phenol TC (1,3,5-tris ((p-hydroxyphenyl)isopropyl)benzene), tris-phenol PA (4(4 (1,1-bis(p-hydroxyphenyl)-ethyl) α,α-dimethyl benzyl)phenol), 4-chloroformyl phthalic anhydride, trimesic acid, benzophenone tetracarboxylic acid, or the like, or combinations including at least one of the foregoing branching agents. The branching agents can be added at a level of about 0.05 to about 2.0 weight percent (wt %), based upon the total weight of the polycarbonate in a given layer.

In one embodiment, the polycarbonate can be produced by a melt polycondensation reaction between a dihydroxy compound and a carbonic acid diester. Examples of the carbonic acid diesters that can be utilized to produce the polycarbonates are diphenyl carbonate, bis(2,4-dichlorophenyl)carbonate, bis(2,4,6-trichlorophenyl)carbonate, bis(2-cyanophenyl) carbonate, bis(o-nitrophenyl)carbonate, ditolyl carbonate, m-cresyl carbonate, dinaphthyl carbonate, bis(diphenyl)carbonate, bis(methylsalicyl)carbonate, diethyl carbonate, dimethyl carbonate, dibutyl carbonate, dicyclohexyl carbonate, or the like, or combinations including at least one of the foregoing carbonic acid diesters. The preferred carbonic acid diester is diphenyl carbonate or bis (methylsalicyl)carbonate.

Preferably, the number average molecular weight of the polycarbonate is about 3,000 to about 1,000,000 grams/mole (g/mole). Within this range, it is desirable to have a number average molecular weight of greater than or equal to about 10,000, preferably greater than or equal to about 20,000, and more preferably greater than or equal to about 25,000 g/mole. Also desirable is a number average molecular weight of less than or equal to about 100,000, preferably less than or equal to about 75,000, more preferably less than or equal to about 50,000, and most preferably less than or equal to about 35,000 g/mole.

Cycloaliphatic polyesters can also be used in the conductive composition and are generally prepared by reaction of organic polymer precursors such as a diol with a dibasic acid or derivative. The diols useful in the preparation of the cycloaliphatic polyester polymers are straight chain, branched, or cycloaliphatic, preferably straight chain or branched alkane diols, and can contain from 2 to 12 carbon atoms.

Suitable examples of diols include ethylene glycol, propylene glycol, i.e., 1,2- and 1,3-propylene glycol; butane diol, i.e., 1,3- and 1,4-butane diol; diethylene glycol, 2,2-dimethyl-1,3-propane diol, 2-ethyl, 2-methyl, 1,3-propane diol, 1,3- and 1,5-pentane diol, dipropylene glycol, 2-methyl-1,5-pentane diol, 1,6-hexane diol, 1,4-cyclohexane dimethanol and particularly its cis- and trans-isomers, triethylene glycol, 1,10-decane diol, and mixtures of any of the foregoing. Particularly preferred is dimethanol bicyclo octane, dimethanol decalin, a cycloaliphatic diol or chemical equivalents thereof and particularly 1,4-cyclohexane dimethanol or its chemical equivalents. If 1,4-cyclohexane dimethanol is to be used as the diol component, it is generally preferred to use a mixture of cis- to trans-isomers in mole ratios of about 1:4 to about 4:1. Within this range, it is generally desired to use a mole ratio of cis- to trans-isomers of about 1:3.

The diacids useful in the preparation of the cycloaliphatic polyester polymers are aliphatic diacids that include carboxylic acids having two carboxyl groups each of which are attached to a saturated carbon in a saturated ring. Suitable examples of cycloaliphatic acids include, norbornene dicarboxylic acids, bicyclo octane dicarboxylic acids. Preferred cycloaliphatic diacids are 1,4-cyclohexanedicarboxylic acid and trans-1,4-cyclohexanedicarboxylic acids. Linear aliphatic diacids are also useful when the polyester has at least one monomer containing a cycloaliphatic ring. Illustrative examples of linear aliphatic diacids are succinic acid, adipic acid, dimethyl succinic acid, and azelaic acid. Mixtures of diacid and diols can also be used to make the cycloaliphatic polyesters.

Cyclohexanedicarboxylic acids and their chemical equivalents can be prepared, for example, by the hydrogenation of cycloaromatic diacids and corresponding derivatives such as isophthalic acid, terephthalic acid or naphthalenic acid in a suitable solvent, water or acetic acid at room temperature and at atmospheric pressure using suitable catalysts such as rhodium supported on a suitable carrier of carbon or alumina. They can also be prepared by the use of an inert liquid medium wherein an acid is at least partially soluble under reaction conditions and a catalyst of palladium or ruthenium in carbon or silica is used.

Typically, during hydrogenation, two or more isomers are obtained wherein the carboxylic acid groups are in either the cis- or trans-positions. The cis-and trans-isomers can be separated by crystallization with or without a solvent, for example, n-heptane, or by distillation. While the cis-isomer tends to blend better, the trans-isomer has higher melting and crystallization temperature and is generally preferred. Mixtures of the cis- and trans-isomers can also be used, and preferably when such a mixture is used, the trans-isomer will preferably include at least about 75 wt % and the cis-isomer will include the remainder based on the total weight of cis- and trans-isomers combined. When a mixture of isomers or more than one diacid is used, a copolyester or a mixture of two polyesters can be used as the cycloaliphatic polyester resin.

Chemical equivalents of these diacids including esters can also be used in the preparation of the cycloaliphatic polyesters. Suitable examples of the chemical equivalents of the diacids are alkyl esters, e.g., dialkyl esters, diaryl esters, anhydrides, acid chlorides, acid bromides, or the like, or combinations including at least one of the foregoing chemical equivalents. The preferred chemical equivalents include the dialkyl esters of the cycloaliphatic diacids, and the most preferred chemical equivalent includes the dimethyl ester of the acid, particularly dimethyl-trans-1,4-cyclohexanedicarboxylate.

Dimethyl-1,4-cyclohexanedicarboxylate can be obtained by ring hydrogenation of dimethylterephthalate, wherein two isomers having the carboxylic acid groups in the cis- and trans-positions are obtained. The isomers can be separated, the trans-isomer being especially preferred. Mixtures of the isomers can also be used as detailed above.

The polyester polymers are generally obtained through the condensation or ester interchange polymerization of the polymer precursors such as diol or diol chemical equivalent component with the diacid or diacid chemical equivalent component and having recurring units of the formula (VIII):

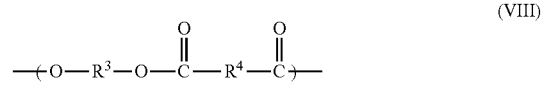

(VIII)

wherein $R^3$ represents an alkyl or cycloalkyl radical containing 2 to 12 carbon atoms and which is the residue of a straight chain, branched, or cycloaliphatic alkane diol having 2 to 12 carbon atoms or chemical equivalents thereof; and $R^4$ is an alkyl or a cycloaliphatic radical which is the decarboxylated residue derived from a diacid, with the proviso that at least one of $R^3$ or $R^4$ is a cycloalkyl group.

A preferred cycloaliphatic polyester is poly(1,4-cyclohexane-dimethanol-1,4-cyclohexanedicarboxylate) having recurring units of formula (IX)

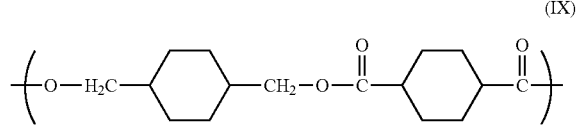

(IX)

wherein in the formula (VIII), $R^3$ is a cyclohexane ring, and wherein $R^4$ is a cyclohexane ring derived from cyclohexanedicarboxylate or a chemical equivalent thereof and is selected from the cis- or trans-isomer or a mixture of cis- and trans-isomers thereof. Cycloaliphatic polyester polymers can be generally made in the presence of a suitable catalyst such as a tetra(2-ethyl hexyl)titanate, in a suitable amount, typically about 50 to 400 ppm of titanium based upon the total weight of the final product. Poly(1,4-cyclohexanedimethanol-1,4-cyclohexanedicarboxylate) generally forms a suitable blend with the polycarbonate. Aromatic polyesters or polyarylates can also be used in the conductive compositions.

Preferably, the number average molecular weight of the copolyestercarbonates or the polyesters is about 3,000 to about 1,000,000 g/mole. Within this range, it is desirable to have a number average molecular weight of greater than or equal to about 10,000, preferably greater than or equal to about 20,000, and more preferably greater than or equal to about 25,000 g/mole. Also desirable is a number average molecular weight of less than or equal to about 100,000, preferably less than or equal to about 75,000, more preferably less than or equal to about 50,000, and most preferably less than or equal to about 35, 000 g/mole.

In another embodiment, the organic polymers include polystyrene. The term "polystyrene" as used herein includes polymers prepared by bulk, suspension and emulsion polymerization, which contain at least 25% by weight of polymer precursors having structural units derived from a monomer of the formula (X):

(X)

wherein $R^5$ is hydrogen, lower alkyl or halogen; $Z^1$ is vinyl, halogen or lower alkyl; and p is from 0 to about 5. These organic polymers include homopolymers of styrene, chlorostyrene and vinyltoluene, random copolymers of styrene with one or more monomers illustrated by acrylonitrile, butadiene, alpha-methylstyrene, ethylvinylbenzene, divinylbenzene and maleic anhydride, and rubber-modified polystyrenes including blends and grafts, wherein the rubber is a polybutadiene or a rubbery copolymer of about 98 to about 70 wt % styrene and about 2 to about 30 wt % diene monomer. Polystyrenes are miscible with polyphenylene ether in all proportions, and any such blend can contain polystyrene in amounts of about 5 to about 95 wt % and most often about 25 to about 75 wt %, based on the total weight of the polymers.

In yet another embodiment, polyimides can be used as the organic polymers in the conductive compositions. Useful thermoplastic polyimides have the general formula (XI)

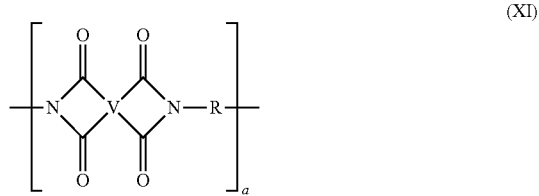

(XI)

wherein a is greater than or equal to about 10, and more preferably greater than or equal to about 1000; and wherein V is a tetravalent linker without limitation, as long as the linker does not impede synthesis or use of the polyimide. Suitable linkers include (a) substituted or unsubstituted, saturated, unsaturated or aromatic monocyclic and polycyclic groups having about 5 to about 50 carbon atoms, (b) substituted or unsubstituted, linear or branched, saturated or unsaturated alkyl groups having 1 to about 30 carbon atoms; or combinations thereof. Suitable substitutions and/or linkers include, but are not limited to, ethers, epoxides, amides, esters, and combinations thereof. Preferred linkers include but are not limited to tetravalent aromatic radicals of formula (XII), such as

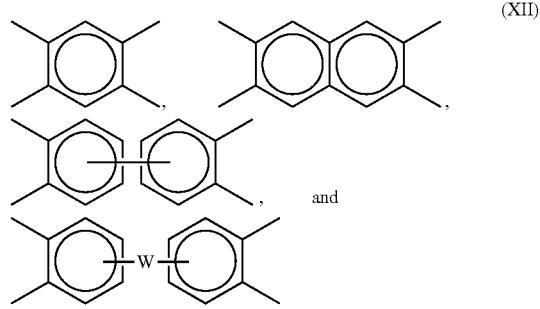

(XII)

wherein W is a divalent moiety selected from the group consisting of —O—, —S—, —C(O)—, —SO$_2$—, —SO—, —C$_y$H$_{2y}$— (y being an integer from 1 to 5), and halogenated derivatives thereof, including perfluoroalkylene groups, or a group of the formula —O—Z—O— wherein the divalent bonds of the —O— or the —O—Z—O— group are in the 3,3',3,4',4,3', or the 4,4' positions, and wherein Z includes, but is not limited, to divalent radicals of formula (XIII).

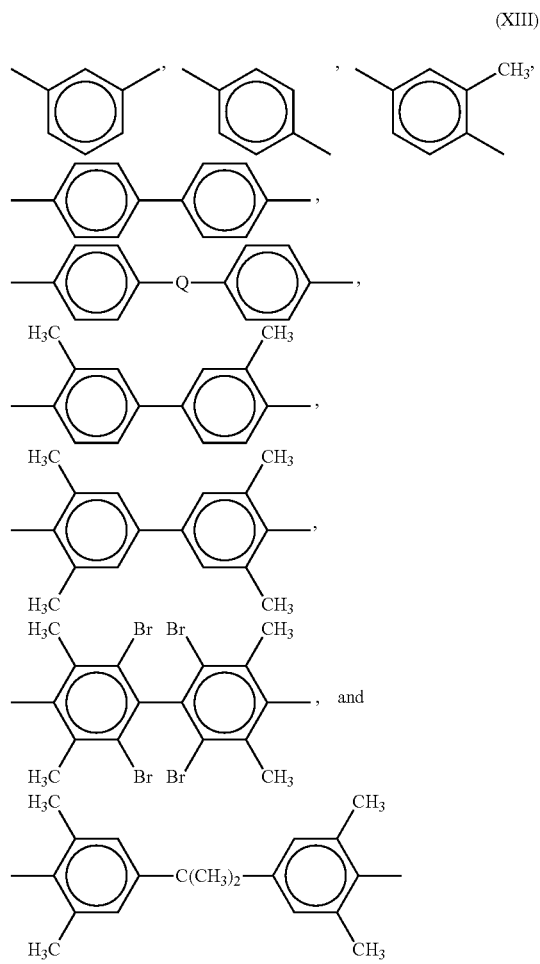

(XIII)

R in formula (XI) includes substituted or unsubstituted divalent organic radicals such as (a) aromatic hydrocarbon radicals having about 6 to about 20 carbon atoms and halogenated derivatives thereof; (b) straight or branched chain alkylene radicals having about 2 to about 20 carbon atoms; (c) cycloalkylene radicals having about 3 to about 20 carbon atoms, or (d) divalent radicals of the general formula (XIV)

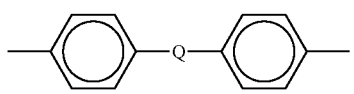

(XIV)

wherein Q includes a divalent moiety selected from the group consisting of —O—, —S—, —C(O)—, —SO$_2$—, —SO—, —C$_y$H$_{2y}$— (y being an integer from 1 to 5), and halogenated derivatives thereof, including perfluoroalkylene groups.

Preferred classes of polyimides that can be used in the conductive compositions include polyamidimides and polyetherimides, particularly those polyetherimides that are melt processable.

Preferred polyetherimide polymers include more than 1, preferably about 10 to about 1000 or more, and more preferably about 10 to about 500 structural units, of the formula (XV)

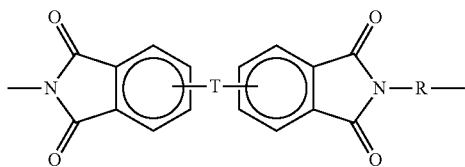

(XV)

wherein T is —O— or a group of the formula —O—Z—O— wherein the divalent bonds of the —O— or the —O—Z—O— group are in the 3,3',3,4',4,3', or the 4,4' positions, and wherein Z includes, but is not limited to, divalent radicals of formula (XIII) as defined above.

In one embodiment, the polyetherimide can be a copolymer, which, in addition to the etherimide units described above, further contains polyimide structural units of the formula (XVI)

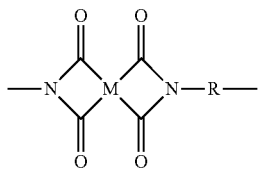

(XVI)

wherein R is as previously defined for formula (XI) and M includes, but is not limited to, radicals of formula (XVII).

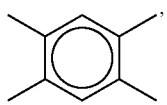

(XVII)

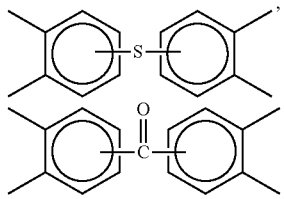, and

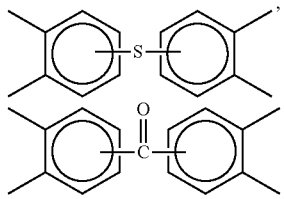

The polyetherimide can be prepared by any of the methods including the reaction of an aromatic bis(ether anhydride) of the formula (XVIII)

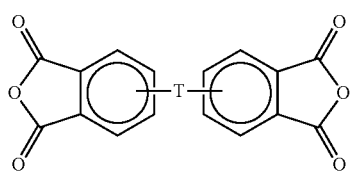

(XVIII)

with an organic diamine of the formula (XIX)

H$_2$N—R—NH$_2$ (XIX)

wherein T and R are defined as described above in formulas (XI) and (XIV).

Illustrative examples of aromatic bis(ether anhydride)s of formula (XVIII) include 2,2-bis[4-(3,4-dicarboxyphenoxy)phenyl]propane dianhydride; 4,4'-bis(3,4-dicarboxyphenoxy)diphenyl ether dianhydride; 4,4'-bis(3,4-dicarboxyphenoxy)diphenyl sulfide dianhydride; 4,4'-bis(3,4-dicarboxyphenoxy)benzophenone dianhydride; 4,4'-bis(3,4-dicarboxyphenoxy)diphenyl sulfone dianhydride; 2,2-bis[4-(2,3-dicarboxyphenoxy)phenyl]propane dianhydride; 4,4'-bis(2,3-dicarboxyphenoxy)diphenyl ether dianhydride; 4,4'-bis(2,3-dicarboxyphenoxy)diphenyl sulfide dianhydride; 4,4'-bis(2,3-dicarboxyphenoxy)benzophenone dianhydride; 4,4'-bis(2,3-dicarboxyphenoxy)diphenyl sulfone dianhydride; 4-(2,3-dicarboxyphenoxy)-4'-(3,4-dicarboxyphenoxy)diphenyl-2,2-propane dianhydride; 4-(2,3-dicarboxyphenoxy)-4'-(3,4-dicarboxyphenoxy)diphenyl ether dianhydride; 4-(2,3-dicarboxyphenoxy)-4'-(3,4-dicarboxyphenoxy)diphenyl sulfide dianhydride; 4-(2,3-dicarboxyphenoxy)-4'-(3,4-dicarboxyphenoxy)benzophenone dianhydride and 4-(2,3-dicarboxyphenoxy)-4'-(3,4-dicarboxyphenoxy)diphenyl sulfone dianhydride, as well as various mixtures thereof.

The bis(ether anhydride)s can be prepared by the hydrolysis, followed by dehydration, of the reaction product of a nitro substituted phenyl dinitrile with a metal salt of dihydric phenol compound in the presence of a dipolar, aprotic solvent. A preferred class of aromatic bis(ether anhydride)s included by formula (XVIII) above includes, but is not limited to, compounds wherein T is of the formula (XX)

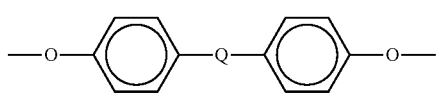

(XX)

and the ether linkages, for example, are preferably in the 3,3',3,4',4,3', or 4,4' positions, and mixtures thereof, and where Q is as defined above.

Any diamino compound can be employed in the preparation of the polyimides and/or polyetherimides. Examples of suitable compounds are ethylenediamine, propylenediamine, trimethylenediamine, diethylenetriamine, triethylenetetramine, hexamethylenediamine, heptamethylenediamine, octamethylenediamine, nonamethylenediamine, decamethylenediamine, 1,12-dodecanediamine, 1,18-octadecanediamine, 3-methylheptamethylenediamine, 4,4-dimethylheptamethylenediamine, 4-methylnonamethylenediamine, 5-methylnonamethylenediamine, 2,5-dimethylhexamethylenediamine, 2,5-dimethylheptamethylenediamine, 2,2-dimethylpropylenediamine, N-methyl-bis(3-aminopropyl) amine, 3-methoxyhexamethylenediamine, 1,2-bis(3-aminopropoxy)ethane, bis(3-aminopropyl)sulfide, 1,4-cyclohexanediamine, bis-(4-aminocyclohexyl)methane, m-phenylenediamine, p-phenylenediamine, 2,4-diaminotoluene, 2,6-diaminotoluene, m-xylylenediamine, p-xylylenediamine, 2-methyl-4,6-diethyl-1,3-phenylene-diamine, 5-methyl-4,6-diethyl-1,3-phenylene-diamine, benzidine, 3,3'-dimethylbenzidine, 3,3'-dimethoxybenzidine, 1,5-diaminonaphthalene, bis(4-aminophenyl)methane, bis(2-chloro-4-amino-3,5-diethylphenyl)methane, bis(4-aminophenyl)propane, 2,4-bis(b-amino-t-butyl)toluene, bis (p-b-amino-t-butylphenyl)ether, bis(p-b-methyl-o-aminophenyl)benzene, bis(p-b-methyl-o-aminopentyl)benzene, 1,3-diamino-4-isopropylbenzene, bis(4-aminophenyl)sulfide, bis(4-aminophenyl)sulfone, bis(4-aminophenyl)ether and 1,3-bis(3-aminopropyl)tetramethyldisiloxane. Mixtures of these compounds can also be present. The preferred diamino compounds are aromatic diamines, especially m- and p-phenylenediamine and mixtures thereof.

In an exemplary embodiment, the polyetherimide resin includes structural units according to formula (XV) wherein each R is independently p-phenylene or m-phenylene or a mixture thereof and T is a divalent radical of the formula (XXI)

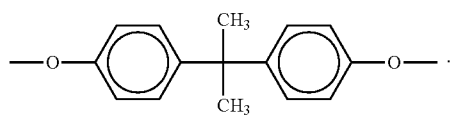
(XXI)

In general, the reactions can be carried out employing solvents such as o-dichlorobenzene, m-cresol/toluene, or the like, to effect a reaction between the anhydride of formula (XVIII) and the diamine of formula (XIX), at temperatures of about 100° C. to about 250° C. Alternatively, the polyetherimide can be prepared by melt polymerization of aromatic bis(ether anhydride)s of formula (XVIII) and diamines of formula (XIX) by heating a mixture of the starting materials to elevated temperatures with concurrent stirring. Generally, melt polymerizations employ temperatures of about 200° C. to about 400° C. Chain stoppers and branching agents can also be employed in the reaction. When polyetherimide/polyimide copolymers are employed, a dianhydride, such as pyromellitic anhydride, is used in combination with the bis (ether anhydride). The polyetherimide polymers can optionally be prepared from reaction of an aromatic bis(ether anhydride) with an organic diamine in which the diamine is present in the reaction mixture at no more than about 0.2 molar excess, and preferably less than about 0.2 molar excess. Under such conditions the polyetherimide resin has less than about 15 microequivalents per gram (µeq/g) acid titratable groups, and preferably less than about 10 µeq/g acid titratable groups, as shown by titration with chloroform solution with a solution of 33 weight percent (wt %) hydrobromic acid in glacial acetic acid. Acid-titratable groups are essentially due to amine end-groups in the polyetherimide resin.

Generally, useful polyetherimides have a melt index of about 0.1 to about 10 grams per minute (g/min), as measured by American Society for Testing Materials (ASTM) D1238 at 295° C., using a 6.6 kilogram (kg) weight. In a preferred embodiment, the polyetherimide resin has a weight average molecular weight (Mw) of about 10,000 to about 150,000 grams per mole (g/mole), as measured by gel permeation chromatography, using a polystyrene standard. Such polyetherimide polymers typically have an intrinsic viscosity greater than about 0.2 deciliters per gram (dl/g), preferably about 0.35 to about 0.7 dl/g measured in m- cresol at 25° C.

In yet another embodiment, polyamides can be used as the organic polymers in the conductive composition. Polyamides are generally derived from the polymerization of organic lactams having from 4 to 12 carbon atoms. Preferred lactams are represented by the formula (XXII)

(XXII)

wherein n is about 3 to about 11. A highly preferred lactam is epsilon-caprolactam having n equal to 5.

Polyamides can also be synthesized from amino acids having from 4 to 12 carbon atoms. Preferred amino acids are represented by the formula (XXIII)

(XXIII)

wherein n is about 3 to about 11. A highly preferred amino acid is epsilon-aminocaproic acid with n equal to 5.

Polyamides can also be polymerized from aliphatic dicarboxylic acids having from 4 to 12 carbon atoms and aliphatic diamines having from 2 to 12 carbon atoms. Suitable and preferred aliphatic dicarboxylic acids are the same as those described above for the synthesis of polyesters. Preferred aliphatic diamines are represented by the formula (XXIV)

$H_2N-(CH_2)_n-NH_2$ (XXIV)

wherein n is about 2 to about 12. A highly preferred aliphatic diamine is hexamethylenediamine ($H_2N(CH_2)_6NH_2$). It is preferred that the molar ratio of the dicarboxylic acid to the diamine be about 0.66 to about 1.5. Within this range it is generally desirable to have the molar ratio be greater than or equal to about 0.81, preferably greater than or equal to about 0.96. Also desirable within this range is an amount of less than or equal to about 1.22, preferably less than or equal to about 1.04. The preferred polyamides are nylon 6, nylon 6,6, nylon 4,6, nylon 6, 12, nylon 10, or the like, or combinations including at least one of the foregoing nylons.

Synthesis of polyamideesters can also be accomplished from aliphatic lactones having from 4 to 12 carbon atoms and aliphatic lactams having from 4 to 12 carbon atoms. The aliphatic lactones are the same as those described above for polyester synthesis, and the aliphatic lactams are the same as those described above for the synthesis of polyamides. The ratio of aliphatic lactone to aliphatic lactam can vary widely depending on the desired composition of the final copolymer, as well as the relative reactivity of the lactone and the lactam. A presently preferred initial molar ratio of aliphatic lactam to aliphatic lactone is about 0.5 to about 4. Within this range a molar ratio of greater than or equal to about 1 is desirable. Also desirable is a molar ratio of less than or equal to about 2.

The conductive precursor composition can further include a catalyst or an initiator. Generally, any known catalyst or initiator suitable for the corresponding thermal polymerization can be used. Alternatively, the polymerization can be conducted without a catalyst or initiator. For example, in the synthesis of polyamides from aliphatic dicarboxylic acids and aliphatic diamines, no catalyst is required.

For the synthesis of polyamides from lactams, suitable catalysts include water and the omega-amino acids corresponding to the ring-opened (hydrolyzed) lactam used in the synthesis. Other suitable catalysts include metallic aluminum alkylates (MAl(OR)$_3$H; wherein M is an alkali metal or alkaline earth metal, and R is $C_1$-$C_{12}$ alkyl), sodium dihydrobis (2-methoxyethoxy)aluminate, lithium dihydrobis(tert-butoxy)aluminate, aluminum alkylates (Al(OR)$_2$R; wherein R is $C_1$-$C_{12}$ alkyl), N-sodium caprolactam, magnesium chloride or bromide salt of epsilon-caprolactam (MgXC$_6$H$_{10}$NO, X=Br or Cl), dialkoxy aluminum hydride. Suitable initiators include isophthaloybiscaprolactam, N-acetalcaprolactam, isocyanate epsilon-caprolactam adducts, alcohols (ROH; wherein R is $C_1$-$C_{12}$ alkyl), diols (HO—R—OH; wherein R is R is $C_1$-$C_{12}$ alkylene), omega-aminocaproic acids, and sodium methoxide.

The polyamides can also be semi-aromatic polyamides, such as PA4.T, PA6.T, or PA9.T polyamides. As used herein, a "semi-aromatic polyamide" is understood to be a polyamide homo- or copolymer that contains aromatic or semi-aromatic units derived from an aromatic dicarboxylic acid, an aromatic diamine, or an aromatic aminocarboxylic acid, the content of said units being at least 50 mol %. In some cases these semi-aromatic polyamides are blended with small amounts of aliphatic polyamides for better processability. They are available commercially, from e.g., DuPont, Wilmington, Del., USA under the Tradename Zytel HTN; Solvay Advanced Polymers under the Tradename Amodel; or from DSM, Sittard, The Netherlands under the Tradename Stanyl For Tii.

For the synthesis of polyamideesters from lactones and lactams, suitable catalysts include metal hydride compounds, such as a lithium aluminum hydride catalysts having the formula LiAl(H)$_x$(R$^1$)$_y$, where x is about 1 to about 4, y is about 0 to about 3, x+y is equal to 4, and R$^1$ is selected from the group consisting of $C_1$-$C_{12}$ alkyl and $C_1$-$C_{12}$ alkoxy; highly preferred catalysts include LiAl(H)(OR$^2$)$_3$, wherein R$^2$ is selected from the group consisting of $C_1$-$C_8$ alkyl; an especially preferred catalyst is LiAl(H)(OC(CH$_3$)$_3$)$_3$. Other suitable catalysts and initiators include those described above for the polymerization of poly(epsilon-caprolactam) and poly (epsilon-caprolactone).

The high molecular weight polyesters used in the practice of the present invention are polymeric diol or glycol esters of terephthalic acid and/or isophthalic acid. They are widely available commercially, e.g., SABIC Innovative Plastics, Pittsfield, Mass., USA, poly(1,4-butylene terephthalate) resins under the Trademark VALOX.RTM., Goodyear Tire and Rubber Company, USA, poly(ethylene terephthalate) under the Tradename VITUF, and PCT (polycyclohexylterephthalate), a high-temperature polyester available commercially from Eastman Chemical Co., Kingsport, TN, USA and DuPont, Wilmington, DE, USA. Otherwise they can be readily prepared by known techniques, such as by the alcoholysis of esters of terephthalic and/or isophthalic acid with a glycol and subsequent polymerization, by heating glycols with free acids or with halide derivatives thereof, and similar processes. These are described in U.S. Pat. Nos. 2,465,319 and 3,047,539, and elsewhere.

Although the glycol portion of the polyester can contain from 2 to 10 atoms, it is preferred that it contain from 2 to 4 carbon atoms in the form of linear methylene chains.

Preferred polyesters will be of the family consisting of high molecular weight polymeric glycol terephthalates or isophthalates having repeating units of the general formula (XXV)

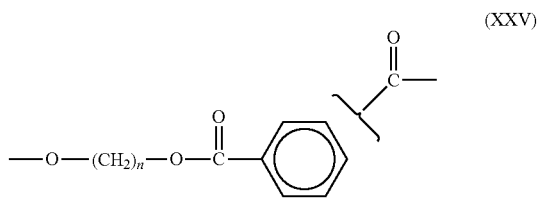

(XXV)

wherein n is a whole number of from 2 to 4, and mixtures of such esters, including copolyesters of terephthalic and isophthalic acids of up to 30 mole percent isophthalic units.

Especially preferred polyesters are poly(ethylene terephthalate) and poly(1,4-butylene terephthalate). Special mention is made of the latter because it crystallizes at such a good rate that it can be used for injection molding without the need for nucleating agents or long cycles, as is sometimes necessary with poly(ethylene terephthalate).

Illustratively, high molecular weight polyesters, such as poly(1,4-butylene terephthalate), will have an intrinsic viscosity of at least about 0.7 deciliters/gram and, preferably, at least 0.8 deciliters/gram as measured in a 60:40 phenol tetrachloroethane mixture at 30.degree. C. At intrinsic viscosities of at least about 1.0 deciliters/gram, there is further enhancement of toughness of the present compositions.

The copolyesters useful for the present compositions are preferably prepared from terephthalic acid, isophthalic acid, or reactive derivatives thereof, or any combination of the foregoing, and a glycol, which can be a straight or branched chain aliphatic and/or cycloaliphatic glycol. Illustratively, the glycol will be ethylene glycol; 1,4-butanediol; 1,5-pentanediol; 1,6-hexanediol; 1,9-nonanediol; 1,10-decanediol; neopentyl glycols; 1,4-cyclohexanediol; 1,4-cyclohexane dimethanol; a mixture of any of the foregoing, or the like. Additionally, other dicarboxylic acids useful for the acid component of the copolyesters include, without limitation, aromatic dicarboxylic acids such as napthalene dicarboxylic acid, and compounds of the formula (XXVI)

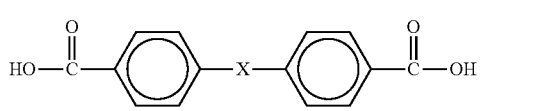

(XXVI)

in which X can be alkylene or alkylidene of from 1 to 4 carbon atoms, carbonyl, sulfonyl, oxygen or a bond between the benzene rings, and the like, and aliphatic dicarboxylic acids having from 6 to 12 carbon atoms in the chain including suberic acid, sebacic acid, azelaic acid, adipic acid and the like.

The foregoing copolyesters can be prepared by ester interchange in accordance with standard procedures. These copolyesters can preferably be derived from at least 50% poly(1,4-butylene terephthalate) units.

Also useful for the compositions of the present invention are block copolyesters derived from blocks of (i) terminally-reactive poly(1,4-butylene terephthalate), preferably of low molecular weight, and (ii) terminally-reactive copolyesters, as described above, or (iii) a terminally-reactive aliphatic polyester, or any combination thereof. The terminal groups can include hydroxyl, carboxyl, carboalkoxy, and the like, including reactive derivatives thereof.

Generally, these block copolyesters can be prepared by reacting the aforementioned terminally-reactive units in the presence of a catalyst for transesterification, such as zinc acetate, manganese acetate, titanium esters and the like. After initial mixing polymerization is carried out under standard conditions, e.g., 220.degree. to 280.degree. C., in a high vacuum e.g., 0.1 to 2 mm Hg, to form the block copolymer of minimum randomization in terms of distribution of chain segments. These block copolyesters are described in U.S. patent application Ser. No. 752,325, filed Dec. 20, 1976, now abandoned, incorporated herein by reference.

Preferably, the copolyester units (ii) are derived from an aliphatic glycol and a mixture of aromatic and aliphatic dibasic acids in which the mole ratio concentration of aromatic to aliphatic acids is from 1 to 9 to about 9 to 1, with an especially preferred range being from about 3 to 7 to about 7 to 3.

Further, the terminally-reactive aliphatic polyester units (iii) will contain substantially stoichiometric amounts of the aliphatic diol and the aliphatic dicarboxylic acid, although hydroxy-containing terminal groups are preferred.

In addition, to their ease of formation by well-known procedures, both the aromatic/aliphatic copolyesters (ii) and the aliphatic polyesters (iii) are commercially available. One source for such materials is the Ruco Division/Hooker Chemical Company, Hicksville, N.Y., which designates its compounds as "Rucoflex."

In general, the block copolyesters useful for the invention preferably include from 95 to 50 parts by weight of segments of poly(1,4-butylene terephthalate). Those poly(1,4-butylene terephthalate) blocks, before incorporation into the block copolyester, will preferably have an intrinsic viscosity of above 0.1 dl/g. and more preferably, between 0.1 to 0.5 dl/g., as measured in a a 60:40 mixture of phenol tetrachlorethane at 30.degree. C. The balance, 50 to 5 parts by weight of the block copolyester will include blocks of copolyester (ii) and aliphatic polyester (iii) above.

As will be understood by those skilled in the art, the poly (1,4-butylene terephthalate) block can be straight chain or branched, e.g., by use of a branching component which contains at least 3 ester-forming groups. This can be a polyol, e.g., pentaerythritol, trimethylolpropane, and the like, or a polybasic acid compound, e.g., trimethyl trimesitate, and the like. Branched poly(1,4-butylene terephthalate) resins and their preparation are described in Borman, U.S. Pat. No. 3,953,404, incorporated herein by reference.

One or more low thermally conductive fillers can be used. The low thermally conductive, electrically insulative filler has an intrinsic thermal conductivity of from 10 to 30 W/mK and, in one aspect, has a resistivity greater than or equal to $10^5$ Ohm.cm. Examples of the low thermally conductive filler include, but are not limited to, ZnS (Zinc sulfide), CaO (Calcium oxide), MgO (Magnesium oxide), ZnO (Zinc oxide), or $TiO_2$ (Titanium dioxide), or a combination thereof.

One or more high thermally conductive, electrically insulative fillers can be used. The high thermally conductive filler has an intrinsic thermal conductivity greater than or equal to 50 W/mK and, in one aspect, has a resistivity greater than or equal to $10^5$ Ohm.cm. Examples of the high thermally conductive, electrically insulative filler include, but are not limited to, AlN (Aluminum nitride), BN (Boron nitride), $MgSiN_2$ (Magnesium silicon nitride), SiC (Silicon carbide), Ceramic-coated graphite, or a combination thereof.

One or more high thermally conductive, electrically conductive fillers can be used. The high thermally conductive, electrically conductive filler has an intrinsic thermal conductivity greater than or equal to 50 W/mK and, in one aspect, has a resistivity less than or equal to 1 Ohm.cm. Examples of the high thermally conductive, electrically conductive filler include, but are not limited to, Graphite, Expanded graphite, Graphene, Carbon fiber, Carbon nanotube (CNT), or Graphitized carbon black, or a combination thereof.

In another aspect, the thermoplastic polymer comprises a polyamide, polyester, polyethylene and ethylene based copolymer, polypropylene, polyphenylene sulfide, polyetheretherketone, polycarbonate, polyetherimide, or a combination thereof; the low thermally conductive, electrically insulative filler comprises ZnS, $TiO_2$, MgO, ZnO, or a combination thereof; the high thermally conductive, electrically insulative filler comprises AlN, BN, SiC, or a combination thereof; and the high thermally conductive, electrically conductive filler comprises graphite, expanded graphite, or a combination thereof.

In one aspect, the thermoplastic polymer is present in an amount of from 35 to 80 volume % of the entire polymeric composition. In another aspect, the thermoplastic polymer is from 45 to 70 volume %, or 55 to 65 volume %. In one aspect, the combination of fillers is present at from 20 to 65 volume %. Typically, the low thermally conductive, electrically insulative filler is present in an amount of from 5-45 volume %, and in other aspects from 20 to 40 volume %. The high thermally conductive, electrically insulative filler is typically present in an amount from 2-15 volume %, and in other aspects from 5 to 10 volume %. The high thermally conductive, electrically conductive filler is typically present in an amount from 2-15 volume %, and in other aspects from 10 to 15 volume %.

The intrinsic thermal conductivity of the low thermally conductive, electrically insulative filler is from 10 to 30 W/mK. In other aspects the intrinsic thermal conductivity of the low thermally conductive, electrically insulative filler is from 15 to 30 W/mK or from 15 to 20 W/mK. The intrinsic thermal conductivity of the high thermally conductive, electrically insulative filler is greater than or equal to 50 W/mK. In other aspects, the intrinsic thermal conductivity of the high thermally conductive, electrically insulative filler is greater than or equal to 100 W/mK or greater than or equal to 150 W/mK. The intrinsic thermal conductivity of the high thermally conductive, electrically conductive filler is greater than or equal to 50 W/mK. In other aspects, the intrinsic thermal conductivity of the high thermally conductive, electrically conductive filler is greater than or equal to 100 W/mK or greater than or equal to 150 W/mK.

The graphite used in the present invention can be synthetically produced or naturally produced, or can be expandable graphite or expanded graphite with a thickness smaller than 1 micron. In one aspect, the graphite is naturally produced. There are three types of naturally produced graphite that are commercially available. They are flake graphite, amorphous graphite and crystal vein graphite. In one aspect, the graphite is flake graphite, wherein the flake graphite is typically found as discrete flakes ranging in size from 10-800 micrometers in diameter and 1-150 micrometers thick and purities ranging from 80-99.9% carbon. In another aspect the graphite is spherical.

The boron nitride used in the invention is typically hexagonal boron nitride (h-BN), which can be complete h-BN or Turbostratic boron nitride (t-BN). The BN particle can be large sized single BN crystal powder, agglomerate of small sized BN particles, the mixture thereof, the agglomerated spherical powder, or BN fiber. In one aspect, the BN average particle size or D50 in diameter can range from 1 to 500 micrometers. In another aspect, within this range, the boron nitride particles have a size of greater than or equal to about 3, or greater than or equal to about 5 micrometers. The particle size indicated here means the single BN particle or its agglomerate at any of their dimensions. In one aspect, the BN has a BN purity ranging from 95% to 99.8%. In one aspect, a large single crystal sized flake BN with an average size ranging from 3 to 50 micrometer and a BN purity of over 98% is used.

In addition to the thermoplastic polymer resin and fillers, the compositions of the present invention can include various additives ordinarily incorporated in resin compositions of this type. Mixtures of additives can be used. Such additives can be mixed at a suitable time during the mixing of the components for forming the composition. The one or more additives are included in the thermoplastic compositions to impart one or more selected characteristics to the thermoplastic compositions and any molded article made therefrom. Examples of additives that can be included in the present invention include, but are not limited to, heat stabilizers, process stabilizers, antioxidants, light stabilizers, plasticizers, antistatic agents, mold releasing agents, UV absorbers, lubricants, pigments, dyes, colorants, flow promoters, flame retardants, or a combination of one or more of the foregoing additives.

Suitable heat stabilizers include, for example, organo phosphites such as triphenyl phosphite, tris-(2,6-dimethylphenyl)phosphite, tris-(mixed mono-and di-nonylphenyl)phosphite or the like; phosphonates such as dimethylbenzene phosphonate or the like, phosphates such as trimethyl phosphate, or the like, or combinations including at least one of the foregoing heat stabilizers. Heat stabilizers are generally used in amounts of from 0.01 to 0.5 parts by weight based on 100 parts by weight of the total composition, excluding any filler.

Suitable antioxidants include, for example, organophosphites such as tris(nonyl phenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis [methylene(3,5-di-tert-butyl-4-hydroxyhydrocinnamate)] methane, or the like; butylated reaction products of para-cresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl)propionate or the like; amides of beta-(3,5-di-tert-butyl-4-hydroxyphenyl)-propionic acid or the like, or combinations including at least one of the foregoing antioxidants. Antioxidants are generally used in amounts of from 0.01 to 0.5 parts by weight, based on 100 parts by weight of the total composition, excluding any filler.

Suitable light stabilizers include, for example, benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone or the like or combinations including at least one of the foregoing light stabilizers. Light stabilizers are generally used in amounts of from 0.1 to 1.0 parts by weight, based on 100 parts by weight of the total composition, excluding any filler.

Suitable plasticizers include, for example, phthalic acid esters such as dioctyl-4,5-epoxy-hexahydrophthalate, tris-(octoxycarbonylethyl)isocyanurate, tristearin, epoxidized soybean oil or the like, or combinations including at least one of the foregoing plasticizers. Plasticizers are generally used in amounts of from 0.5 to 3.0 parts by weight, based on 100 parts by weight of the total composition, excluding any filler.

Suitable antistatic agents include, for example, glycerol monostearate, sodium stearyl sulfonate, sodium dodecylbenzenesulfonate, polyether block amides, which are commercially available from, for example, BASF under the Tradename Irgastat; from Arkema under the Tradename PEBAX; and from Sanyo Chemical industries under the tradename Pelestat, or combinations of the foregoing antistatic agents. In one embodiment, carbon fibers, carbon nanofibers, carbon nanotubes, carbon black, or any combination of the foregoing can be used in a polymeric resin containing chemical antistatic agents to render the composition electrostatically dissipative.

Suitable mold releasing agents include for example, metal stearate, stearyl stearate, pentaerythritol tetrastearate, beeswax, montan wax, paraffin wax, or the like, or combinations including at least one of the foregoing mold release agents. Mold releasing agents are generally used in amounts of from 0.1 to 1.0 parts by weight, based on 100 parts by weight of the total composition, excluding any filler.

Suitable UV absorbers include for example, hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol (CYASORB™ 5411); 2-hydroxy-4-n-octyloxybenzophenone (CYASORB™ 531); 2-[4,6-bis(2,4-dimethylphenyl)-1,3,5-triazin-2-yl]-5-(octyloxy)-phenol (CYASORB™ 1164); 2,2'-(1,4-phenylene)bis(4H-3,1-benzoxazin-4-one) (CYASORB™ UV-3638); 1,3-bis[[(2-cyano-3,3-diphenylacryloyl) oxy]-2,2-bis[[(2-cyano-3,3-diphenylacryloyl)oxy]methyl] propane (UVINUL™ 3030); 2,2'-(1,4-phenylene) bis(4H-3,1-benzoxazin-4-one); 1,3-bis[(2-cyano-3,3-diphenylacryloyl)oxy]-2,2-bis[[(2-cyano-3,3-diphenylacryloyl)oxy]methyl]propane; nano-size inorganic materials such as titanium oxide, cerium oxide, and zinc oxide, all with particle size less than 100 nanometers; or the like, or combinations including at least one of the foregoing UV absorbers. UV absorbers are generally used in amounts of from 0.01 to 3.0 parts by weight, based on 100 parts by weight based on 100 parts by weight of the total composition, excluding any filler.

Suitable lubricants include for example, fatty acid esters such as alkyl stearyl esters, e.g., methyl stearate or the like; mixtures of methyl stearate and hydrophilic and hydrophobic surfactants including polyethylene glycol polymers, polypropylene glycol polymers, and copolymers thereof e.g., methyl stearate and polyethylene-polypropylene glycol copolymers in a suitable solvent; or combinations including at least one of the foregoing lubricants. Lubricants are generally used in amounts of from 0.1 to 5 parts by weight, based on 100 parts by weight of the total composition, excluding any filler.

Suitable pigments include for example, inorganic pigments such as metal oxides and mixed metal oxides such as zinc oxide, titanium dioxides, iron oxides or the like; sulfides such as zinc sulfides, or the like; aluminates; sodium sulfo-silicates; sulfates and chromates; zinc ferrites; ultramarine blue; Pigment Brown 24; Pigment Red 101; Pigment Yellow 119; organic pigments such as azos, di-azos, quinacridones, perylenes, naphthalene tetracarboxylic acids, flavanthrones, isoindolinones, tetrachloroisoindolinones, anthraquinones, anthanthrones, dioxazines, phthalocyanines, and azo lakes; Pigment Blue 60, Pigment Red 122, Pigment Red 149, Pigment Red 177, Pigment Red 179, Pigment Red 202, Pigment Violet 29, Pigment Blue 15, Pigment Green 7, Pigment Yellow 147 and Pigment Yellow 150, or combinations including at least one of the foregoing pigments. Pigments are generally used in amounts of from 1 to 10 parts by weight, based on 100 parts by weight based on 100 parts by weight of the total composition, excluding any filler.

Suitable dyes include, for example, organic dyes such as coumarin 460 (blue), coumarin 6 (green), nile red or the like; lanthanide complexes; hydrocarbon and substituted hydrocarbon dyes; polycyclic aromatic hydrocarbons; scintillation dyes (preferably oxazoles and oxadiazoles); aryl- or heteroaryl-substituted poly (2-8 olefins); carbocyanine dyes; phthalocyanine dyes and pigments; oxazine dyes; carbostyryl dyes; porphyrin dyes; acridine dyes; anthraquinone dyes; arylmethane dyes; azo dyes; diazonium dyes; nitro dyes; quinone imine dyes; tetrazolium dyes; thiazole dyes; perylene dyes, perinone dyes; bis-benzoxazolylthiophene (BBOT); and xanthene dyes; fluorophores such as anti-stokes shift dyes which absorb in the near infrared wavelength and emit in the visible wavelength, or the like; luminescent dyes such as 5-amino-9-diethyliminobenzo(a)phenoxazonium perchlorate; 7-amino-4-methylcarbostyryl; 7-amino-4-methylcoumarin; 3-(2'-benzimidazolyl)-7-N,N-diethylaminocoumarin; 3-(2'-benzothiazolyl)-7-diethylaminocoumarin; 2-(4-biphenylyl)-5-(4-t-butylphenyl)-1,3,4-oxadiazole; 2-(4-biphenyl)-6-phenylbenzoxazole-1,3; 2,5-Bis-(4-biphenylyl)-1,3,4-oxadiazole; 2,5-bis-(4-biphenylyl)-oxazole; 4,4'-bis-(2-butyloctyloxy)-p-quaterphenyl; p-bis(o-methylstyryl)-benzene; 5,9-diaminobenzo(a)phenoxazonium perchlorate; 4-dicyanomethylene-2-methyl-6-(p-dimethylaminostyryl)-4H-pyran; 1,1'-diethyl-2,2'-carbocyanine iodide; 3,3'-diethyl-4,4',5,5'-dibenzothiatricarbocyanine iodide; 7-diethylamino-4-methylcoumarin; 7-diethylamino-4-trifluoromethylcoumarin; 2,2'-dimethyl-p-quaterphenyl; 2,2-dimethyl-p-terphenyl; 7-ethylamino-6-methyl-4-trifluoromethylcoumarin; 7-ethylamino-4-trifluoromethylcoumarin; nile red; rhodamine 700; oxazine 750; rhodamine 800; IR 125; IR 144; IR 140; IR 132; IR 26; IR5; diphenylhexatriene; diphenylbutadiene; tetraphenylbutadiene; naphthalene; anthracene; 9,10-diphenylanthracene; pyrene; chrysene; rubrene; coronene; phenanthrene or the like, or combinations including at least one of the foregoing dyes. Dyes are generally used in amounts of from 0.1 to 5 parts by weight, based on 100 parts by weight of the total composition, excluding any filler.

Suitable colorants include, for example titanium dioxide, anthraquinones, perylenes, perinones, indanthrones, quinacridones, xanthenes, oxazines, oxazolines, thioxanthenes, indigoids, thioindigoids, naphthalimides, cyanines, xanthenes, methines, lactones, coumarins, bis-benzoxazolylthiophene (BBOT), napthalenetetracarboxylic derivatives, monoazo and disazo pigments, triarylmethanes, aminoketones, bis(styryl)biphenyl derivatives, and the like, as well as combinations including at least one of the foregoing colorants. Colorants are generally used in amounts of from 0.1 to 5 parts by weight, based on 100 parts by weight of the total composition, excluding any filler.

Suitable blowing agents include for example, low boiling halohydrocarbons and those that generate carbon dioxide; blowing agents that are solid at room temperature and when heated to temperatures higher than their decomposition temperature, generate gases such as nitrogen, carbon dioxide, ammonia gas, such as azodicarbonamide, metal salts of azodicarbonamide, 4,4' oxybis(benzenesulfonylhydrazide), sodium bicarbonate, ammonium carbonate, or the like, or combinations including at least one of the foregoing blowing agents. Blowing agents are generally used in amounts of from 1 to 20 parts by weight, based on 100 parts by weight of the total composition, excluding any filler.

Additionally, materials to improve flow and other properties can be added to the composition, such as low molecular weight hydrocarbon resins or dendritic polyols (such as Boltorn from Perstop) or dendritic polyesteramides (such as Hybrane from DSM). Particularly useful classes of low molecular weight hydrocarbon resins are those derived from petroleum $C_5$ to $C_9$ feedstock that are derived from unsaturated $C_5$ to $C_9$ monomers obtained from petroleum cracking. Non-limiting examples include olefins, e.g. pentenes, hexenes, heptenes and the like; diolefins, e.g. pentadienes, hexadienes and the like; cyclic olefins and diolefins, e.g. cyclopentene, cyclopentadiene, cyclohexene, cyclohexadiene, methyl cyclopentadiene and the like; cyclic diolefin dienes, e.g., dicyclopentadiene, methylcyclopentadiene dimer and the like; and aromatic hydrocarbons, e.g. vinyltoluenes, indenes, methylindenes and the like. The resins can additionally be partially or fully hydrogenated.

Examples of flame retardants include, but are not limited to, halogenated flame retardants, like tretabromo bisphenol A oligomers such as BC58 and BC52, brominated polystyrene or poly(dibromo-styrene), brominated epoxies, decabromodiphenyleneoxide, pentabrombenzyl acrylate monomer, pentabromobenzyl acrylate polymer, ethylene- bis(tetrabromophthalimide, bis(pentabromobenzyl)ethane, metal hydroxides like $Mg(OH)_2$ and $Al(OH)_3$, melamine cyanurate, phosphor based FR systems like red phosphorus, melamine polyphosphate, phosphate esters, metal phosphinates, ammonium polyphosphates, expandable graphites, sodium or potassium perfluorobutane sulfate, sodium or potassium perfluorooctane sulfate, sodium or potassium diphenylsulfone sulfonate and sodium- or potassium-2,4,6-trichlorobenzoate and N-(p-tolylsulfonyl)-p-toluenesulfimide potassium salt, N—(N'-benzylaminocarbonyl)sulfanylimide potassium salt, or a combination containing at least one of the foregoing. Fillers and additives can be added in amounts ranging from 0.1 to about 40% by weight percent of the total composition.

The thermoplastic compositions of the present invention can be readily formed using any known method in the art of dispersing one or more fillers in a thermoplastic resin. The thermally conductive and electrically insulative compositions or composites can generally be processed by a melt compounding process or solution blending process.

Melt blending of the moldable composition involves the use of shear force, extensional force, compressive force, ultrasonic energy, electromagnetic energy, thermal energy or combinations comprising at least one of the foregoing forces or forms of energy and is conducted in processing equipment wherein the aforementioned forces or forms of energy are exerted by a single screw, multiple screws, intermeshing co-rotating or counter rotating screws, non-intermeshing co-rotating or counter rotating screws, reciprocating screws, screws with pins, screws with screens, barrels with pins, rolls, rams, helical rotors, or combinations comprising at least one of the foregoing.

Melt blending involving the aforementioned forces can be conducted in machines such as single or multiple screw extruders, Buss kneader, Henschel, helicones, Ross mixer, Banbury, roll mills, molding machines such as injection molding machines, vacuum forming machines, blow molding machine, or the like, or combinations comprising at least one of the foregoing machines.

In one embodiment, the organic polymer in powder form, pellet form, sheet form, or the like, can be first dry blended with the fillers in a Henschel or in a roll mill, prior to being fed into a melt blending device such as an extruder or Buss kneader. It can be desirable to introduce the fillers into the melt blending device in the form of a masterbatch. In such a process, the masterbatch can be introduced into the melt blending device downstream of the point where the organic polymer is introduced.

A melt blend is one where at least a portion of the organic polymer has reached a temperature greater than or equal to about the melting temperature, if the resin is a semi-crystalline organic polymer, or the flow point (e.g., the glass transition temperature) if the resin is an amorphous resin during the blending process. A dry blend is one where the entire mass of organic polymer is at a temperature less than or equal to about the melting temperature if the resin is a semi-crystalline organic polymer, or at a temperature less than or equal to the flow point if the organic polymer is an amorphous resin and wherein organic polymer is substantially free of any liquid-like fluid during the blending process. A solution blend, as defined herein, is one where the organic polymer is suspended in a liquid-like fluid such as, for example, a solvent or a non-solvent during the blending process.

The moldable composition comprising the organic polymer and fillers can be subject to multiple blending and forming steps if desirable. For example, the moldable composition can first be extruded and formed into pellets. The pellets can then be fed into a molding machine where it can be formed into any desirable shape or product. Alternatively, the moldable composition emanating from a single melt blender can be formed into sheets or strands and subjected to post-extrusion processes such as annealing, uniaxial or biaxial orientation.

In one aspect, the fillers can first be dry blended together with any foregoing mentioned additives, then fed into an extruder from one or multi-feeders, or fillers separately feed into extruder from one or multi-feeders. The organic polymer resin or any polymer combination can be, in one aspect, in powder or pellet form, and can be first dry blended with each other, or dry blended with any combination of the foregoing mentioned fillers, then fed into an extruder from one or multiple-feeders. The fillers used in the invention can also be first processed into a masterbatch, and then fed into an extruder.

The feeding of organic polymers, fillers, masterbatch or any combination of polymers, fillers blends can be fed into an extruder from a throat hopper or any side feeders on the extruder.

The extruders used in the invention can have a single screw, multiple screws, intermeshing co-rotating or counter rotating screws, non-intermeshing co-rotating or counter rotating screws, reciprocating screws, screws with pins, screws with screens, barrels with pins, rolls, rams, helical rotors, or combinations comprising at least one of the foregoing. The melt blending of the composites involves the use of shear force, extensional force, compressive force, ultrasonic energy, electromagnetic energy, thermal energy or combinations comprising at least one of the foregoing forces or forms of energy.

The barrel temperature on the extruder during compounding can be set at the temperature where at least a portion of the organic polymer has reached a temperature greater than or equal to about the melting temperature, if the resin is a semi-crystalline organic polymer, or the flow point (e.g., the glass transition temperature) if the resin is an amorphous resin.

Solution blending can also be used to manufacture the moldable composition. The solution blending can also use additional energy such as shear, compression, ultrasonic vibration, or the like, to promote homogenization of fillers with the organic polymer. In one embodiment, an organic polymer suspended in a fluid can be introduced into an ultrasonic sonicator along with any foregoing fillers. The mixture can be solution blended by sonication for a time period effective to disperse the fillers into the organic polymers. The organic polymer along with the fillers can then be dried, extruded and molded if desired.

The moldable composition comprising the organic polymer, fillers, and optional additives can be subject to multiple blending and forming steps if desirable. For example, the moldable composition can first be extruded and formed into pellets. The pellets can then be fed into a molding machine where it can be formed into any desirable shape or product. Alternatively, the moldable composition emanating from a single melt blender can also be formed into sheets or strands and subjected to post-extrusion processes such as annealing, uniaxial or biaxial orientation.

The polymeric compositions can be formed into moldable stock material or moldable articles using techniques known to those in the art.

The polymeric compositions and moldable composites display thermally conductive, but electrically insulative properties. In one aspect, the composition is characterized by: (i) a thermal conductivity of at least 1.0 W/mK; and (ii.) a volume resistivity of at least $10^7$ Ohm.cm.

In one aspect, the invention herein achieves the surprising result of a high thermally conductive composition by using substantial amount of a low thermally conductive filler, and achieving a final composition thermal conductivity that exceeds the thermal conductivity that one would expect based on the thermal conductivity of the individual components. This means that an unexpected synergetic effect between the different fillers leads to a surprisingly high thermal conductivity of the compositions. Moreover, at the same time, the composition maintains a high level of volume resistivity (i.e. the composition is electrically insulative). The filler combination of the invention typically has a relatively low hardness, which facilitates melt processing. Additionally, the filler combination of the invention typically has a low cost-structure, since the low thermally conductive fillers are relatively low-cost as compared to the high thermally conductive fillers. As a result the compositions of the invention have a high thermal conductivity at a lower-cost structure and/or better processability (less wear) than current commercial compositions.

The compositions of this invention can be formed into an article of manufacture. In one aspect the article can be a molded article. In one aspect, the compositions and articles herein can be used in heat or thermal dissipation management applications where electrical insulation is required. Examples include, but are not limited to, heat sinks for electronic components in computers and consumer electrical appliances, solar cells and batteries such as processors, lamps, LED-lamps, electric motors, electric circuits, the encapsulation of electronics, such as coils or casings, solar cell back sheets, battery casings, or the manufacture of heat exchangers for highly problematic (corrosive) environments.

EXAMPLES

The following examples are put forth so as to provide those of ordinary skill in the art with a complete disclosure and description of how the compounds, compositions, articles, devices, and/or methods described and claimed herein are made and evaluated, and are intended to be purely exemplary and are not intended to limit the scope of what the inventors regard as their invention. Efforts have been made to ensure accuracy with respect to numbers (e.g., amounts, temperature, etc.) but some errors and deviations should be accounted for. Unless indicated otherwise, parts are parts by volume, temperature is in ° C. or is at ambient temperature, and pressure is at or near atmospheric. Due to the anisotropic nature of some fillers, the through-plane thermal conductivity as measured by ASTM E1461, when using anisotropic fillers, is dependant on sample preparation. All samples as described herein are prepared by compression molding into discs of 12.7 mm in diameter and with a thickness of 3 mm.

As used herein below the following are abbreviated as follows:
HDPE is high density polyethylene.
BN is boron nitride.
ZnS is zinc sulphide.
$TiO_2$ is titanium dioxide.
MgO is magnesium oxide.
$CaCO_3$ is calcium carbonate
TC is the thermal conductivity of the composition.

Example 1

HDPE (Hostalen GC-7260, Basell), ZnS (Sachtolith (agglomerates of sub-μm particles), Sachtleben), BN (Coolflow CF300 (platelets/agglomerates, $D_{50}$=15-25 μm), Momentive Performance Materials) and Graphite (Thermocarb TC300 (platelet with $D_{90}$~200 μm), Asbury Graphite) were formulated into a composition in the proportions set forth below in Table 1. The HDPE, ZnS, BN and Graphite were premixed in the solid state and were subsequently melt-compounded at 200° C. and 80 rpm on a Thermo Scientific Haake Polylab OS system equipped with a batch-mixer with Roller rotors, having a total internal volume of 65 cm$^3$. The compositions were compression molded into 10×5×3 cm plaques by using a Dr Collin press at 240° C. and 100 bar. Cylindrical-shaped samples (3 mm thick, 12.7 mm diameter) were cut from the plaques and the through-plane thermal conductivity of the sample compositions was measured according to ASTM E1461. The results are set forth below in Table 1 and FIG. 1.

TABLE 1

| Run # | Polymer | ZnS (vol %) | BN (vol %) | Graphite (vol %) | TC (W/mK) | Volume Resistivity (Ω · cm) |
|---|---|---|---|---|---|---|
| 1 | HDPE | 35 | 0 | 15 | 2.72 | >10$^7$ |
| 2 | HDPE | 26 | 9 | 15 | 3.29 | >10$^7$ |
| 3 | HDPE | 18 | 18 | 15 | 3.28 | >10$^7$ |
| 4 | HDPE | 0 | 35 | 15 | 3.31 | >10$^7$ |

Table 1 and FIG. 1 show the thermal conductivities of thermally conductive composites containing 15 vol % graphite and a total filler content of 50 vol %, where the ZnS and BN volume contents vary. This means that the total volume content of filler is constant at 50 vol % and that the relative ZnS and BN contents are varied from 35 vol % ZnS (=0 vol % BN) to 0 vol % ZnS (=35 vol % BN).

Run 1 shows that the composite containing only ZnS and graphite has a relatively low thermal conductivity. Upon partial replacement of the low thermally conductive ZnS by the high thermally conductive BN, one would expect a linear increase in the thermal conductivity of the composite, with a maximum thermal conductivity at 0 vol % ZnS and 35 vol % BN. However, an unexpected and significant increase of the thermal conductivity is already achieved by replacing a small amount of the ZnS with BN, as shown by run 2. In fact, run 2 shows a thermal conductivity that is as high as the thermal conductivity of the composites containing graphite and high BN contents (runs 3 and 4), which indicates the presence of a synergetic effect of the three different fillers in these compositions. These results show that low thermally conductive fillers like ZnS can be used to produce composites with a high thermal conductivity or, in other words, large amounts of the high thermally conductive filler can be replaced by a low thermally conductive filler while retaining the thermal conductivity of the composite.

Comparative Example 2

Similar to the process of Example 1, HDPE (Hostalen GC-7260, Basell), ZnS (Sachtolith (agglomerates of sub-μm particles), Sachtleben), BN (Coolflow CF300 (platelets/agglomerates, $D_{50}$=15-25 μm), Momentive Performance Materials) and Graphite (Thermocarb TC300 (platelet with $D_{90}$~200 μm), Asbury Graphite) were formulated into a composition in the proportions set forth below in Table 2 and the through-plane thermal conductivity of the sample compositions was measured according to ASTM E1461. The results are set forth in Table 2 and FIG. 2.

TABLE 2

| Run # | Polymer | ZnS (vol %) | BN (vol %) | Graphite (vol %) | TC (W/mK) | Volume Resistivity (Ω · cm) |
|---|---|---|---|---|---|---|
| 5 | HDPE | 50 | 0 | 0 | 1.99 | >10$^7$ |
| 6 | HDPE | 38 | 13 | 0 | 1.97 | >10$^7$ |
| 7 | HDPE | 25 | 25 | 0 | 2.22 | >10$^7$ |
| 8 | HDPE | 0 | 50 | 0 | 2.58 | >10$^7$ |

Figure 2:
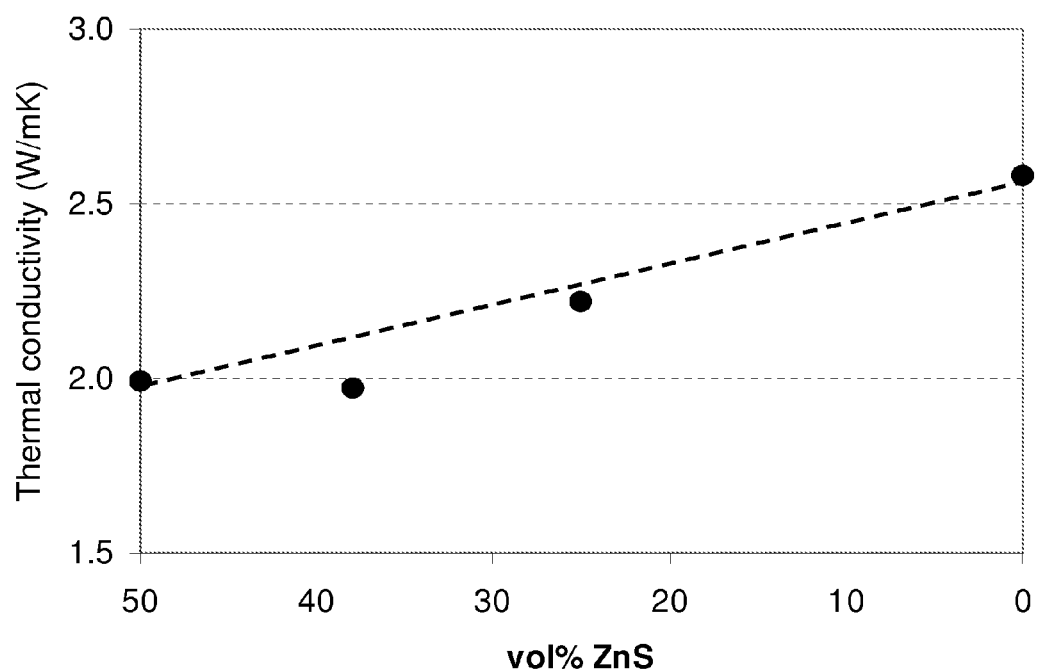
FIG. 2 is graph of TC vs. vol % ZnS for the data from Table 2.

Table 2 and FIG. 2 show the thermal conductivities of thermally conductive composites containing 0 vol % graphite and a total filler content of 50 vol %, where the ZnS and BN volume contents vary. This means that the total volume content of filler is constant at 50 vol % and that the relative ZnS and BN contents are varied from 50 vol % ZnS (=0 vol % BN) to 0 vol % ZnS (=50 vol % BN).

Run 5 shows that the composite containing only ZnS has a relatively low thermal conductivity. In contrast to the results presented in Example 1, the partial replacement of ZnS by BN in the absence of graphite only leads to a linear increase in thermal conductivity (runs 6-8). These results show that the presence of a high thermally conductive, electrically conductive filler, for example, graphite, obtains the observed synergetic effects.

Example 3

Similar to the process of Example 1, HDPE (Hostalen GC-7260, Basell), $TiO_2$ (Tiona RL-91 (agglomerates of sub-μm particles), Millennium), BN (Coolflow CF300 (platelets/agglomerates, $D_{50}$=15-25 μm), Momentive Performance Materials) and Graphite (Thermocarb TC300 (platelet with $D_{90}$~200 μm), Asbury Graphite) were formulated into a composition in the proportions set forth below in Table 3 and the through-plane thermal conductivity of the sample compositions was measured according to ASTM E1461. The results are set forth in Table 3 and FIG. 3.

TABLE 3

| Run # | Polymer | TiO$_2$ (vol %) | BN (vol %) | Graphite (vol %) | TC (W/mK) | Volume Resistivity (Ω · cm) |
|---|---|---|---|---|---|---|
| 9 | HDPE | 35 | 0 | 15 | 2.57 | >10$^7$ |
| 10 | HDPE | 26 | 9 | 15 | 3.14 | >10$^7$ |
| 11 | HDPE | 18 | 18 | 15 | 3.08 | >10$^7$ |
| 12 | HDPE | 0 | 35 | 15 | 3.31 | >10$^7$ |

Figure 3:
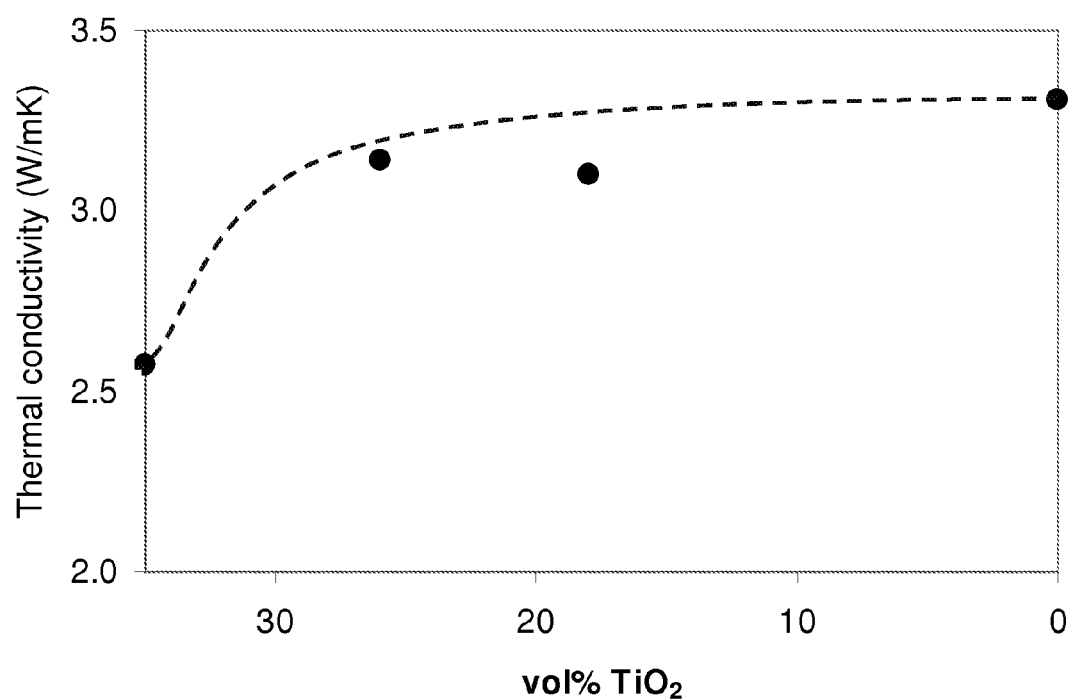
FIG. 3 is graph of TC vs. vol % $TiO_2$ for the data from Table 3.

Table 3 and FIG. 3 show the thermal conductivities of thermally conductive composites containing 15 vol % graphite and a total filler content of 50 vol %, where the TiO$_2$ and BN volume contents vary. This means that the total volume content of filler is constant at 50 vol % and that the relative TiO$_2$ and BN contents are varied from 35 vol % TiO$_2$ (=0 vol % BN) to 0 vol % TiO$_2$ (=35 vol % BN).

Run 9 shows that the composite containing only TiO$_2$ and graphite has a relatively low thermal conductivity. Upon partial replacement of the low thermally conductive TiO$_2$ by the high thermally conductive BN, one would expect a linear increase in the thermal conductivity of the composite, with a maximum thermal conductivity at 0 vol % TiO$_2$ and 35 vol % BN. However, an unexpected and significant increase of the thermal conductivity is already achieved by replacing a small amount of the TiO$_2$ with BN, as shown by run 10. In fact, the composite of run 10 shows a thermal conductivity that is as high as the thermal conductivity of the composites containing graphite and a high BN content (runs 11 and 12). Similar to Example 1, these results indicate the presence of a synergetic effect of the three different fillers in these compositions and show that low thermally conductive fillers like TiO$_2$ can be used to produce composites with a high thermal conductivity or, in other words, large amounts of the high thermally conductive filler can be replaced by a low thermally conductive filler while retaining the thermal conductivity of the composite.

Comparative Example 4

Similar to the process of Example 1, HDPE (Hostalen GC-7260, Basell), TiO$_2$ (Tiona RL-91 (agglomerates of sub-μm particles), Millennium), BN (Coolflow CF300 (platelets/agglomerates, $D_{50}$=15-25 μm), Momentive Performance Materials) and Graphite (Thermocarb TC300 (platelet with $D_{90}$~200 μm), Asbury Graphite) were formulated into a composition in the proportions set forth below in Table 4 and the through-plane thermal conductivity of the sample compositions was measured according to ASTM E1461. The results are set forth in Table 4 and FIG. 4.

TABLE 4

| Run # | Polymer | TiO$_2$ (vol %) | BN (vol %) | Graphite (vol %) | TC (W/mK) | Volume Resistivity (Ω · cm) |
|---|---|---|---|---|---|---|
| 13 | HDPE | 50 | 0 | 0 | 1.58 | >10$^7$ |
| 14 | HDPE | 38 | 13 | 0 | 1.79 | >10$^7$ |
| 15 | HDPE | 25 | 25 | 0 | 2.24 | >10$^7$ |
| 16 | HDPE | 0 | 50 | 0 | 2.58 | >10$^7$ |

Figure 4:
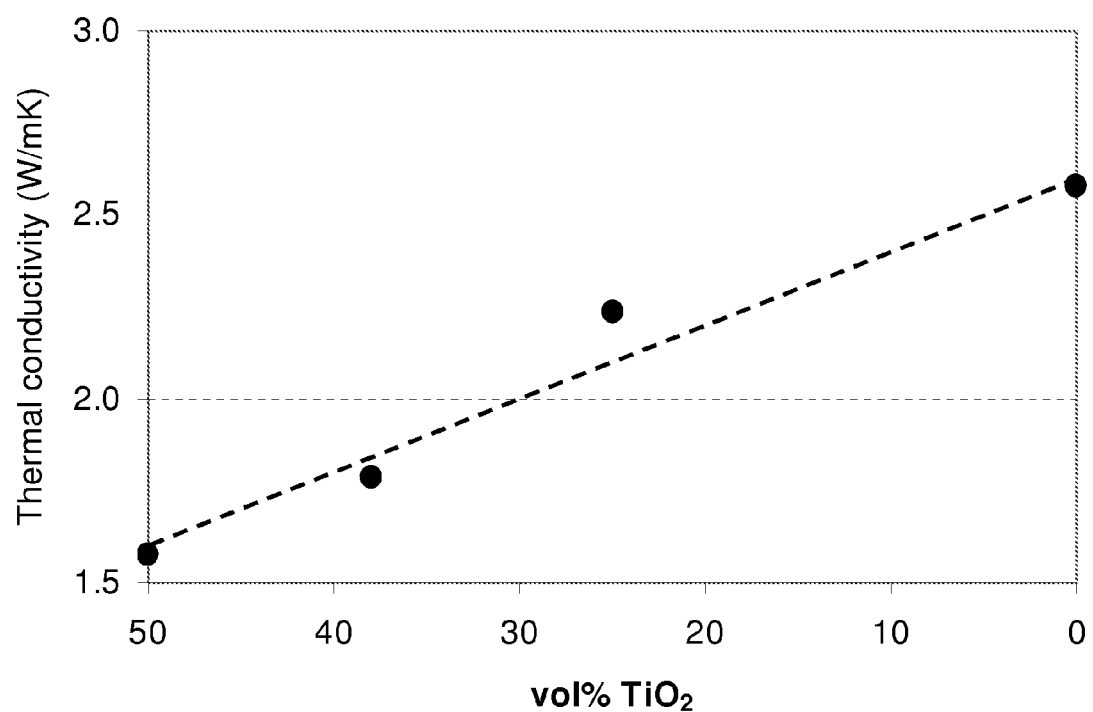
FIG. 4 is graph of TC vs. vol % $TiO_2$ for the data from Table 4.

Table 4 and FIG. 4 show the thermal conductivities of thermally conductive composites containing 0 vol % graphite and a total filler content of 50 vol %, where the TiO$_2$ and BN volume contents vary. This means that the total volume content of filler is constant at 50 vol % and that the relative TiO$_2$ and BN contents are varied from 50 vol % TiO$_2$ (=0 vol % BN) to 0 vol % TiO$_2$ (=50 vol % BN).

Run 13 shows that the composite containing only TiO$_2$ has a relatively low thermal conductivity. In contrast to the results presented in Example 3, the partial replacement of TiO$_2$ by BN in the absence of graphite only leads to a linear increase in thermal conductivity (runs 14-16). These results show that the presence of a high thermally conductive, electrically conductive filler, for example, graphite, obtains the observed synergetic effects.

Example 5

Similar to the process of Example 1, HDPE (Hostalen GC-7260, Basell), MgO (Maglite DE (agglomerates of sub-μm particles), Promecome), BN (Coolflow CF300 (platelets/agglomerates, $D_{50}$=15-25 μm), Momentive Performance Materials) and Graphite (Thermocarb TC300 (platelet with $D_{90}$~200 μm), Asbury Graphite) were formulated into a composition in the proportions set forth below in Table 5 and the through-plane thermal conductivity of the sample compositions was measured according to ASTM E1461. The results are set forth in Table 5 and FIG. 5.

TABLE 5

| Run # | Polymer | MgO (vol %) | BN (vol %) | Graphite (vol %) | TC (W/mK) | Volume Resistivity (Ω · cm) |
|---|---|---|---|---|---|---|
| 17 | HDPE | 35 | 0 | 15 | 2.64 | >10$^7$ |
| 18 | HDPE | 26 | 9 | 15 | 3.29 | >10$^7$ |
| 19 | HDPE | 18 | 18 | 15 | 3.28 | >10$^7$ |
| 20 | HDPE | 0 | 35 | 15 | 3.31 | >10$^7$ |

Figure 5:
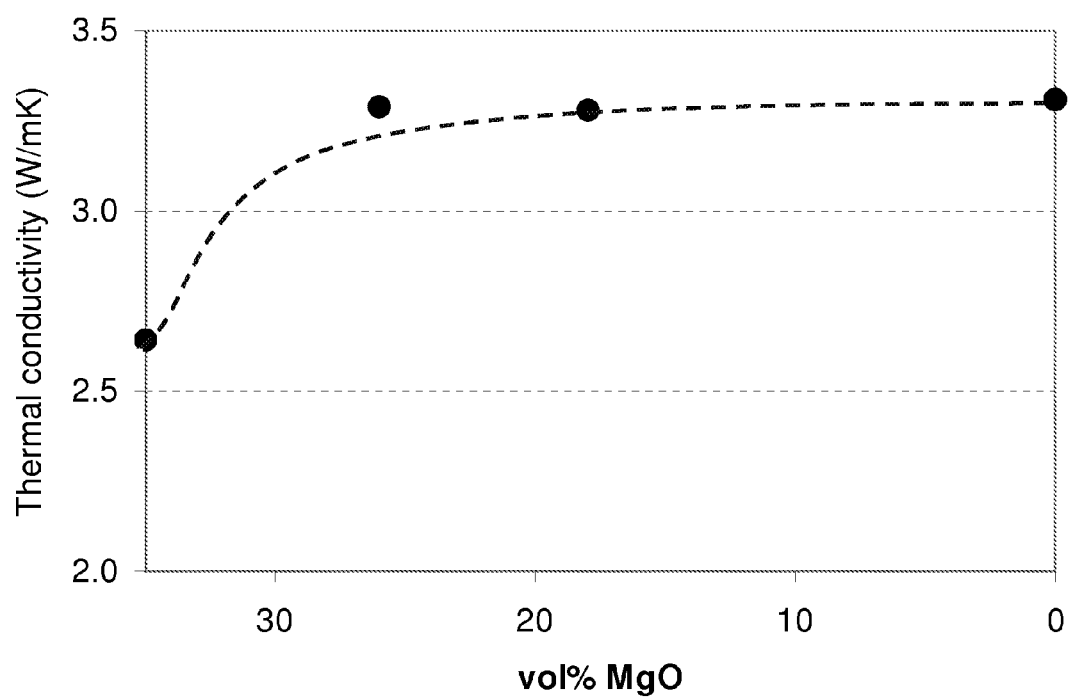
FIG. 5 is graph of TC vs. vol % MgO for the data from Table 5.

Table 5 and FIG. 5 show the thermal conductivities of thermally conductive composites containing 15 vol % graphite and a total filler content of 50 vol %, where the MgO and BN volume contents vary. This means that the total volume content of filler is constant at 50 vol % and that the relative MgO and BN contents are varied from 35 vol % MgO (=0 vol % BN) to 0 vol % MgO (=35 vol % BN).

Run 17 shows that the composite containing only MgO and graphite has a relatively low thermal conductivity. Upon partial replacement of the low thermally conductive MgO by the high thermally conductive BN, one would expect a linear increase in the thermal conductivity of the composite, with a maximum thermal conductivity at 0 vol % MgO and 35 vol % BN. However, an unexpected and significant increase of the thermal conductivity is already achieved by replacing a small amount of the MgO with BN, as shown by run 18. In fact, the composite of run 18 shows a thermal conductivity that is as high as the thermal conductivity of the composites containing graphite and a high BN content (runs 19 and 20). Similar to Example 1, these results indicate the presence of a synergetic effect of the three different fillers in these compositions and show that low thermally conductive fillers like MgO can be used to produce composites with a high thermal conductivity or, in other words, large amounts of the high thermally conductive filler can be replaced by a low thermally conductive filler while retaining the thermal conductivity of the composite.

Comparative Example 6

Similar to the process of Example 1, HDPE (Hostalen GC-7260, Basell), CaCO$_3$ (Millicarb ($D_{50}$~2.5 μm), Omya), BN (Coolflow CF300 (platelets/agglomerates, $D_{50}$=15-25 μm), Momentive Performance Materials) and Graphite (Thermocarb TC300 (platelet with $D_{90}$~200 μm), Asbury Graphite) were formulated into a composition in the proportions set forth below in Table 6 and the through-plane thermal conductivity of the sample compositions was measured according to ASTM E1461. The results are set forth in Table 6 and FIG. 6.

TABLE 6

| Run # | Polymer | $CaCO_3$ (vol %) | BN (vol %) | Graphite (vol %) | TC (W/mK) | Volume Resistivity (Ω·cm) |
|---|---|---|---|---|---|---|
| 21 | HDPE | 35 | 0 | 15 | 2.19 | >$10^7$ |
| 22 | HDPE | 26 | 9 | 15 | 2.47 | >$10^7$ |
| 23 | HDPE | 18 | 18 | 15 | 2.81 | >$10^7$ |
| 24 | HDPE | 0 | 35 | 15 | 3.31 | >$10^7$ |

Figure 6:
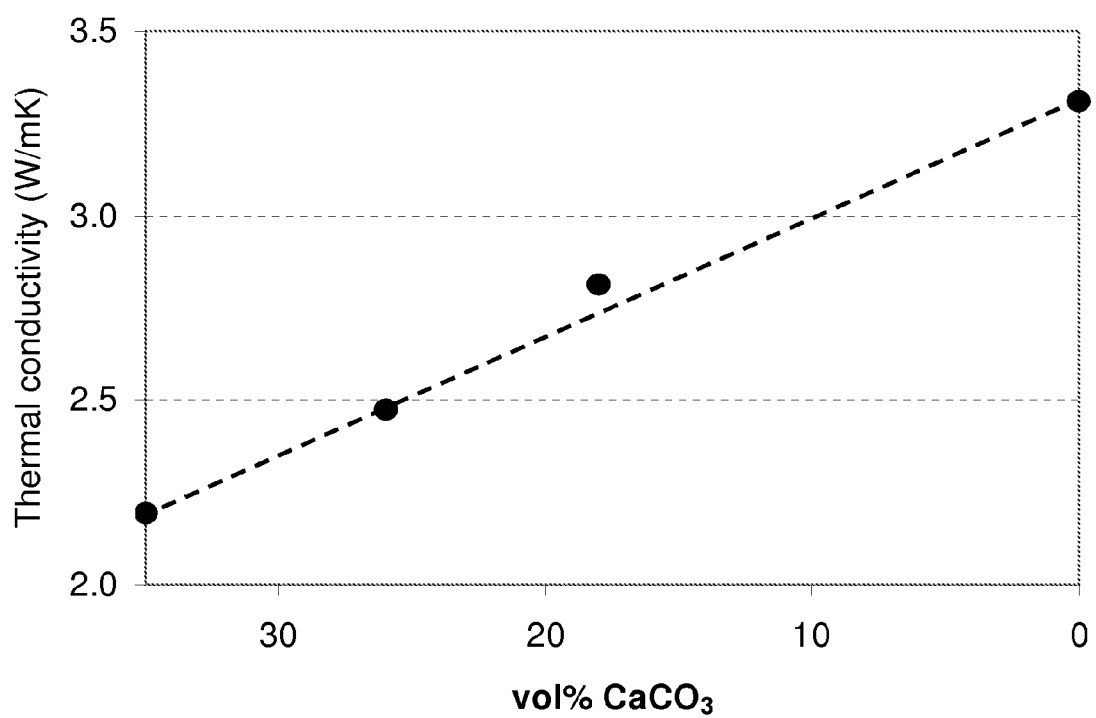
FIG. 6 is graph of TC vs. vol % $CaCO_3$ for the data from Table 6.

Table 6 and FIG. 6 show the thermal conductivities of thermally conductive composites containing 15 vol % graphite and a total filler content of 50 vol %, where the $CaCO_3$ and BN volume contents vary. This means that the total volume content of filler is constant at 50 vol % and that the relative $CaCO_3$ and BN contents are varied from 35 vol % $CaCO_3$ (=0 vol % BN) to 0 vol % $CaCO_3$ (=35 vol % BN). $CaCO_3$ belongs to the group of thermally insulative fillers, since it has an intrinsic thermal conductivity below 10 W/mK.

Run 21 shows that the composite containing only $CaCO_3$ and graphite has a relatively low thermal conductivity. In contrast to the results presented in Examples 1, 3, and 5, the partial replacement of $CaCO_3$ by BN in the presence of 15 vol % graphite only leads to a linear increase in thermal conductivity (runs 22-24). These results show that the advantageous effects of the three-component system described herein are not observed when using a thermally insulative filler in place of the low thermally conductive filler.

Throughout this application, various publications are referenced. The disclosures of these publications in their entireties are hereby incorporated by reference into this application in order to more fully describe the compounds, compositions and methods described herein.

Various modifications and variations can be made to the compounds, compositions and methods described herein. Other aspects of the compounds, compositions and methods described herein will be apparent from consideration of the specification and practice of the compounds, compositions and methods disclosed herein. It is intended that the specification and examples be considered as exemplary.

What is claimed is:

1. A composition comprising:
   a. from 35 to 80 vol % of a thermoplastic polymer;
   b. from 5 to 45 vol % of a low thermally conductive, electrically insulative filler with an intrinsic thermal conductivity of from 10 to 30 W/mK;
   c. from 2 to 15 vol % of a high thermally conductive, electrically insulative filler with an intrinsic thermal conductivity greater than or equal to 50 W/mK and
   d. from 2 to 15 vol % of a high thermally conductive, electrically conductive filler with an intrinsic thermal conductivity greater than or equal to 50 W/mK, wherein the composition is characterized by:
      i. a thermal conductivity of at least 1.0 W/mK;
      ii. a volume resistivity of at least $10^7$ Ohm.cm.

2. The composition of claim 1, wherein the thermoplastic polymer comprises a polyamide, polyester, polyethylene and ethylene based copolymer, polypropylene, polyphenylene sulfide, polyetheretherketone, polycarbonate, polyetherimide, or a combination thereof.

3. The composition of claim 1, wherein the thermoplastic polymer comprises a polyamide, polyester, polyethylene and ethylene based copolymer, polypropylene, polyphenylene sulfide, or a combination thereof.

4. The composition of claim 1, wherein the low thermally conductive filler comprises ZnS, CaO, MgO, ZnO, $TiO_2$, or a combination thereof.

5. The composition of claim 1, wherein the low thermally conductive filler comprises ZnS, $TiO_2$, MgO, or a combination thereof.

6. The composition of claim 1, wherein the high thermally conductive, electrically insulative filler comprises AlN, BN, $MgSiN_2$, SiC, ceramic-coated graphite, or a combination thereof.

7. The composition of claim 1, wherein the high thermally conductive, electrically insulative filler comprises boron nitride, silicon carbide, or a combination thereof.

8. The composition of claim 1, wherein the high thermally conductive, electrically conductive filler comprises graphite, expanded graphite, graphene, a carbon fiber, a carbon nanotube, graphitized carbon black, or a combination thereof.

9. The composition of claim 1, wherein the high thermally conductive, electrically conductive filler comprises graphite, expanded graphite, or a combination thereof.

10. The composition of claim 1, wherein the thermoplastic polymer comprises a polyamide, polyester, polyethylene and ethylene based copolymer, polypropylene, polyphenylene sulfide, or a combination thereof; the low thermally conductive filler comprises, ZnS, $TiO_2$, MgO, or a combination thereof; the high thermally conductive, electrically insulative filler comprises boron nitride; and the high thermally conductive, electrically conductive filler comprises graphite.

11. An article formed from the composition of claim 1.

12. The article of claim 11, wherein the article is a molded article.

13. A method of using a thermoplastic polymer composition in a high thermal conductivity application comprising contacting the thermoplastic polymer composition of claim 1 with an elevated external temperature, wherein the thermoplastic polymer composition is used in an application requiring the composition to have (1) a thermal conductivity of at least 1.0 W/mK, and (2) a volume resistivity of at least $10^7$ Ohm.cm.

14. The method of claim 13, wherein the polymer composition is in the form of an article.

15. The method of claim 14, wherein the article is a molded article.

* * * * *